United States Patent
Komatsu et al.

(10) Patent No.: US 12,301,214 B2
(45) Date of Patent: *May 13, 2025

(54) SURFACE ACOUSTIC WAVE RESONATOR WITH MODULATED PITCH

(71) Applicant: Skyworks Solutions, Inc., Irvine, CA (US)

(72) Inventors: Tomoya Komatsu, Irvine, CA (US); Yiliu Wang, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 143 days.

This patent is subject to a terminal disclaimer.

(21) Appl. No.: 17/743,031

(22) Filed: May 12, 2022

(65) Prior Publication Data
US 2023/0009576 A1 Jan. 12, 2023

Related U.S. Application Data

(60) Provisional application No. 63/218,682, filed on Jul. 6, 2021, provisional application No. 63/218,848, filed
(Continued)

(51) Int. Cl.
*H03H 9/64* (2006.01)
*H03H 9/02* (2006.01)
(Continued)

(52) U.S. Cl.
CPC ...... *H03H 9/6483* (2013.01); *H03H 9/02637* (2013.01); *H03H 9/02842* (2013.01);
(Continued)

(58) Field of Classification Search
CPC ............... H03H 9/14582; H03H 9/145; H03H 9/02842; H03H 9/02637; H03H 9/6483; H04B 1/12; H04B 1/40
See application file for complete search history.

(56) References Cited

U.S. PATENT DOCUMENTS 5,793,266 A 8/1998 Allen et al.
6,259,336 B1 7/2001 Ichikawa
(Continued)

FOREIGN PATENT DOCUMENTS

CN 114513188 A 5/2022
CN 116961620 A 10/2023
(Continued)

OTHER PUBLICATIONS

Caron et al., "Improved rejection band in SAW ladder filters using high frequency shunt element", 2004 IEEE Ultrasonics Ferroelectrics, and Frequency Control Joint 50th Anniversary Conference, pp. 963-965.
(Continued)

*Primary Examiner* — Raymond S Dean
(74) *Attorney, Agent, or Firm* — Knobbe, Martens, Olson & Bear, LLP

(57) ABSTRACT

A surface acoustic wave resonator that has at least a first resonant frequency and a second resonant frequency is disclosed. The surface acoustic wave resonator can include an interdigital transducer electrode over a piezoelectric layer. The interdigital transducer electrode includes fingers having a first pitch. The surface acoustic wave resonator can also include a set of reflectors that is positioned over the piezoelectric layer. The set of reflectors includes a number of reflectors having a second pitch. The first pitch is greater than the second pitch. The number of reflectors is configured so as to compensate for degradation of a quality factor of the surface acoustic wave resonator due to having the first pitch greater than the second pitch.

20 Claims, 14 Drawing Sheets

Related U.S. Application Data on Jul. 6, 2021, provisional application No. 63/218,678, filed on Jul. 6, 2021.

(51) Int. Cl.
    *H03H 9/145*     (2006.01)
    *H03H 9/25*     (2006.01)
    *H04B 1/12*     (2006.01)
    *H04B 1/40*     (2015.01)

(52) U.S. Cl.
    CPC ........ *H03H 9/145* (2013.01); *H03H 9/14582* (2013.01); *H03H 9/25* (2013.01); *H04B 1/12* (2013.01); *H04B 1/40* (2013.01)

(56) References Cited

U.S. PATENT DOCUMENTS

| | | |
|---|---|---|
| 6,518,860 B2 | 2/2003 | Ella et al. |
| 6,927,651 B2 | 8/2005 | Larson, III et al. |
| 7,138,889 B2 | 11/2006 | Lakin |
| 7,190,242 B2 | 3/2007 | Takamine |
| 7,619,347 B1 | 11/2009 | Bhattacharjee |
| 9,473,107 B2 | 10/2016 | Komatsu et al. |
| 9,518,863 B2 | 12/2016 | Tsuzuki et al. |
| 10,389,391 B2 | 8/2019 | Ito et al. |
| 11,368,139 B2 | 6/2022 | Garcia |
| 11,437,976 B2 | 9/2022 | Kaneda et al. |
| 11,545,960 B2 | 1/2023 | Goto |
| 11,621,695 B2 | 4/2023 | Esquius Morote |
| 11,799,447 B2 | 10/2023 | Kaneda et al. |
| 11,881,836 B2 | 1/2024 | Zhang et al. |
| 11,909,377 B2 | 2/2024 | Caron et al. |
| 2005/0001696 A1* | 1/2005 | Otsuka ............... H03H 9/14588 333/195 |
| 2006/0151203 A1 | 7/2006 | Krueger et al. |
| 2006/0214748 A1* | 9/2006 | Funami ................. H03H 9/643 333/195 |
| 2009/0179715 A1 | 7/2009 | Takamine |
| 2009/0261921 A1 | 10/2009 | Moriya et al. |
| 2011/0018389 A1* | 1/2011 | Fukano ................ H03H 9/1092 29/25.35 |
| 2011/0298564 A1 | 12/2011 | Iwashita et al. |
| 2012/0074811 A1 | 3/2012 | Pang et al. |
| 2012/0188026 A1 | 7/2012 | Yamaji et al. |
| 2013/0083044 A1 | 4/2013 | Zuo et al. |
| 2014/0049341 A1 | 2/2014 | Komatsu et al. |
| 2014/0070906 A1 | 3/2014 | Ikeuchi et al. |
| 2016/0380616 A1* | 12/2016 | Takamine .......... H03H 9/14538 333/133 |
| 2017/0310305 A1 | 10/2017 | Komura |
| 2018/0076786 A1 | 3/2018 | Funahashi |
| 2018/0076793 A1 | 3/2018 | Khlat et al. |
| 2018/0138892 A1 | 5/2018 | Caron |
| 2018/0175823 A1 | 6/2018 | Tsukidate |
| 2018/0294797 A1 | 10/2018 | Ozasa |
| 2018/0337657 A1 | 11/2018 | Ruby et al. |
| 2020/0162053 A1 | 5/2020 | Goto et al. |
| 2020/0244246 A1* | 7/2020 | Numata ............. H03H 9/02685 |
| 2020/0313651 A1* | 10/2020 | Kondo ............... H03H 9/02637 |
| 2020/0358424 A1 | 11/2020 | Kaneda et al. |
| 2020/0366268 A1* | 11/2020 | Goto .................. H03H 9/02866 |
| 2021/0119609 A1 | 4/2021 | Kaneda et al. |
| 2021/0159878 A1 | 5/2021 | Zhang et al. |
| 2022/0123726 A1 | 4/2022 | Garcia et al. |
| 2022/0200571 A1 | 6/2022 | Wang et al. |
| 2022/0200572 A1 | 6/2022 | Wang et al. |
| 2022/0352873 A1 | 11/2022 | Garcia et al. |
| 2023/0008248 A1* | 1/2023 | Komatsu ........... H03H 9/02637 |
| 2023/0009576 A1 | 1/2023 | Komatsu et al. |
| 2023/0010291 A1 | 1/2023 | Komatsu et al. |
| 2023/0025241 A1 | 1/2023 | Garcia et al. |
| 2023/0208396 A1 | 6/2023 | Hiramatsu et al. |
| 2023/0223921 A1 | 7/2023 | Akira |
| 2024/0088867 A1 | 3/2024 | Kaneda et al. |
| 2024/0162880 A1 | 5/2024 | Zhang et al. |

FOREIGN PATENT DOCUMENTS

| | | |
|---|---|---|
| WO | 2023/074373 A1 | 5/2023 |
| WO | 2024/127942 A1 | 6/2024 |
| WO | 2024/128020 A1 | 6/2024 |

OTHER PUBLICATIONS

Ivira et al., "Modeling for temperature compensation and temperature characterizations of BAW resonators at GHz frequencies", IEEE Transactions on Ultrasonics, Ferroelectrics, and Frequency Control, vol. 55(2):421-430 (Feb. 2008).

Kadota, Michio, RF Filter using Boundary Acoustic Wave., Japanese Journal of Applied Physics, May 2006, pp. 4651-4654.

Reinhardt et al., "Multiple frequency solidly mounted BAW filters", ResearchGate, https://www.researchgate.nt/publication/252027705, DOI: 10.1109/FCS.2011.5977800 (May 2011).

Zou et al., "Dual-mode thin film bulk acoustic wave resonator and filter", Journal of Applied Physics, vol. 128, 124503 (2020); https://doi.org/10.1063/5.0028702.

Kando, et al., RF Filter using Boundary Acoustic Wave., Japanese Journal of Applied Physics, May 2006, pp. 4651-4654.

* cited by examiner

SURFACE ACOUSTIC WAVE RESONATOR WITH MODULATED PITCH

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/218,678, filed Jul. 6, 2021, titled "SURFACE ACOUSTIC WAVE RESONATOR WITH MODULATED PITCH," U.S. Provisional Patent Application No. 63/218,848, filed Jul. 6, 2021, titled "MULTI-MODE LONGITUDINALLY COUPLED SURFACE ACOUSTIC WAVE RESONATOR WITH MODULATED PITCH," and U.S. Provisional Patent Application No. 63/218,682, filed Jul. 6, 2021, titled "SURFACE ACOUSTIC WAVE RESONATOR WITH ASYMMETRIC REFLECTORS," are hereby incorporated by reference under 37 CFR 1.57 in their entirety.

BACKGROUND

Technical Field

Embodiments of this disclosure relate to surface acoustic wave devices with two or more resonant frequencies.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed. A multi-mode SAW filter, such as a double-mode SAW (DMS) filter, can include a plurality of longitudinally coupled interdigital transducer electrodes positioned between acoustic reflectors.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

SUMMARY

The innovations described in the claims each have several aspects, no single one of which is solely responsible for its desirable attributes. Without limiting the scope of the claims, some prominent features of this disclosure will now be briefly described.

In one aspect, a surface acoustic wave resonator that has at least a first resonant frequency and a second resonant frequency is disclosed. The surface acoustic wave resonator can include an interdigital transducer electrode over a piezoelectric layer. The interdigital transducer electrode includes fingers having a first pitch. The surface acoustic wave resonator can include a set of reflectors over the piezoelectric layer. The set of reflectors includes a number of reflectors having a second pitch. The first pitch is greater than the second pitch. The number of reflectors are configured to compensate for degradation of a quality factor of the surface acoustic wave resonator due to having the first pitch greater than the second pitch.

In one embodiment, the surface acoustic wave resonator further includes a second set of reflectors over the piezoelectric layer. The interdigital transducer electrode can be positioned between the set of reflectors and the second set of reflectors. The second set of reflectors can include a second number of reflectors having a third pitch. The first pitch of the interdigital transducer electrode can be greater than the third pitch. The second pitch and the third pitch can be the same. The second pitch and the third pitch can be different.

In one embodiment, the first pitch is 1% to 20% greater than the second pitch. The first pitch can be 10% to 20% greater than the second pitch.

In one embodiment, an acoustic wave filter that is configured to filter a radio frequency signal includes the surface acoustic wave resonator as a shunt acoustic wave resonator.

In one aspect, a surface acoustic wave resonator that has at least a first resonant frequency and a second resonant frequency is disclosed. The surface acoustic wave resonator can include an interdigital transducer electrode over a piezoelectric layer. The interdigital transducer electrode includes fingers having a first pitch. The surface acoustic wave resonator can include a set of reflectors over the piezoelectric layer. The set of reflectors includes a number of reflectors having a second pitch. The first pitch is greater than the second pitch. The number of reflectors are configured so as to compensate for reduction of a reflection of the surface acoustic wave resonator provided by the set of reflectors due to having the first pitch greater than the second pitch.

In one embodiment, the surface acoustic wave resonator further includes a second set of reflectors over the piezoelectric layer. The interdigital transducer electrode can be positioned between the set of reflectors and the second set of reflectors. The second set of reflectors can include a second number of reflectors having a third pitch. The first pitch of the interdigital transducer electrode can be greater than the third pitch. The second pitch and the third pitch can be the same. The second pitch and the third pitch can be different.

In one embodiment, the first pitch is 1% to 20% greater than the second pitch. The first pitch can be 10% to 20% greater than the second pitch.

In one embodiment, an acoustic wave filter that is configured to filter a radio frequency signal includes the surface acoustic wave resonator as a shunt acoustic wave resonator.

In one embodiment, a packaged module includes a substrate supporting at least one filter. The at least one filter can include one or more of the surface acoustic wave resonator. The packaged module can be a radio frequency front end module. The packaged module can be a diversity receive module. A wireless communication device can include an antenna, a transceiver, and one or more of the packaged modules.

In one aspect, an acoustic wave filter is disclosed. The acoustic wave filter can include shunt acoustic wave resonators that includes a first shunt acoustic wave resonator. The first shunt acoustic wave resonator includes an interdigital transducer electrode having fingers with a first pitch and a set of reflectors having a number of reflectors with a second pitch. The first pitch is greater than the second pitch. The number of reflectors are configured so as to compensate for degradation of a quality factor of the surface acoustic wave resonator due to having the first pitch greater than the second pitch. The first shunt acoustic resonator has at least a first resonant frequency and a second resonant frequency. The acoustic wave filter can include series acoustic wave resonators. The series acoustic wave resonators and the shunt acoustic wave resonators are together arranged to filter a radio frequency signal.

In one embodiment, the first pitch is 10% to 20% greater than the second pitch.

In one embodiment, the first shunt acoustic wave resonator further includes a second set of reflectors having a second number of reflectors with a third pitch. The interdigital transducer electrode can be positioned between the set of reflectors and the second set of reflectors. The first pitch of the interdigital transducer electrode can be greater than the third pitch.

In one aspect, a surface acoustic wave resonator that has at least a first resonant frequency and a second resonant frequency is disclosed. The surface acoustic wave resonator can include an interdigital transducer electrode over a piezoelectric layer. The interdigital transducer electrode includes fingers having a first pitch. The surface acoustic wave resonator can include a first set of reflectors over the piezoelectric layer. The first set of reflectors includes a first number of reflectors having a second pitch. The first pitch is greater than the second pitch. The surface acoustic wave resonator can include a second set of reflectors over the piezoelectric layer. The second set of reflectors includes a second number of reflectors having a third pitch. The second number of reflectors is different from the first number of reflectors. The second set of reflectors is positioned such that the interdigital transducer electrode is positioned between the first set of reflectors and the second set of reflectors.

In one embodiment, the second pitch and the third pitch are the same.

In one embodiment, the second pitch and the third pitch are different. The first pitch can be greater than the third pitch.

In one embodiment, the first pitch is 1% to 20% greater than the second pitch. The first pitch can be 10% to 20% greater than the second pitch.

In one embodiment, an acoustic wave filter that is configured to filter a radio frequency signal includes the surface acoustic wave resonator as a shunt acoustic wave resonator.

In one embodiment, the number of reflectors are configured so as to compensate for degradation of a quality factor of the SAW resonator due to having the first pitch greater than the second pitch.

In one embodiment, the surface acoustic wave resonator further includes a second interdigital transducer electrode over the piezoelectric layer and is positioned between the interdigital transducer electrode and the first set of reflectors. The surface acoustic wave resonator can further include a third interdigital transducer electrode over the piezoelectric layer and is positioned between the interdigital transducer electrode and the second set of reflectors.

In one aspect, an acoustic wave filter is disclosed. The acoustic wave filter can include shunt acoustic wave resonators that includes a first shunt acoustic wave resonator. The first shunt acoustic wave resonator includes an interdigital transducer electrode having fingers with a first pitch, a first set of reflectors having a first number of reflectors with a second pitch, and a second set of reflectors having a second number of reflectors with a third pitch. The first pitch is greater than the second pitch. The first number is different from the second number. The first shunt acoustic resonator has at least a first resonant frequency and a second resonant frequency. The acoustic wave filter can include series acoustic wave resonators. The series acoustic wave resonators and the shunt acoustic wave resonators are together arranged to filter a radio frequency signal.

In one embodiment, the second pitch and the third pitch are the same.

In one embodiment, the second pitch and the third pitch are different. The first pitch can be greater than the third pitch.

In one embodiment, the first pitch is 1% to 20% greater than the second pitch. The first pitch can be 10% to 20% greater than the second pitch.

In one embodiment, a packaged module that includes a substrate supporting at least one filter includes one or more of the surface acoustic wave resonator. The packaged module can be a radio frequency front end module. The packaged module can be a diversity receive module. A wireless communication device includes an antenna, a transceiver, and one or more of the packaged modules of any of the preceding claims.

In one aspect, a multimode longitudinally coupled surface acoustic wave resonator is disclosed. The multimode longitudinally coupled surface acoustic wave resonator can include a first interdigital transducer electrode over a piezoelectric layer. The first interdigital transducer electrode includes fingers having a first pitch. The multimode longitudinally coupled surface acoustic wave resonator can include a first set of reflectors over the piezoelectric layer. The first set of reflectors includes a first number of reflectors having a second pitch. The first pitch is greater than the second pitch. The multimode longitudinally coupled surface acoustic wave resonator can include a second set of reflectors over the piezoelectric layer. The second set of reflectors includes a second number of reflectors having a third pitch. The first pitch is greater than the third pitch. The multimode longitudinally coupled surface acoustic wave resonator can include a second interdigital transducer electrode over the piezoelectric layer and positioned between the first interdigital transducer electrode and the first set of reflectors. The second interdigital transducer electrode includes fingers having a fourth pitch.

In one embodiment, the second pitch and the third pitch are the same.

In one embodiment, the second pitch and the third pitch are different.

In one embodiment, the first pitch is 1% to 20% greater than the second pitch. The first pitch can be 10% to 20% greater than the second pitch.

In one embodiment, an acoustic wave filter configured to filter a radio frequency signal includes the multimode longitudinally coupled surface acoustic wave resonator as a shunt acoustic wave resonator.

In one embodiment, the multimode longitudinally coupled surface acoustic wave resonator further includes a third interdigital transducer electrode over the piezoelectric layer and positioned between the first interdigital transducer electrode and the second set of reflectors. The third interdigital transducer electrode can include fingers having a fifth pitch. The fifth pitch of the third interdigital transducer electrode can be different from the first pitch of the first interdigital transducer electrode.

In one embodiment, the fourth pitch is greater than the second pitch.

In one embodiment, a packaged module including a substrate supporting at least one filter includes one or more surface acoustic wave resonators. The packaged module can be a radio frequency front end module. The packaged module can be a diversity receive module.

In one embodiment, a wireless communication device includes an antenna, a transceiver, and one or more of the packaged modules.

In one aspect, an acoustic wave filter is disclosed. The acoustic wave filter can include shunt acoustic wave resonators that includes a first shunt acoustic wave resonator. The first shunt acoustic wave resonator includes an interdigital transducer electrode having fingers with a first pitch, a first set of reflectors having a first number of reflectors with a second pitch, a second set of reflectors having a second number of reflectors with a third pitch, and a second interdigital transducer electrode having fingers with a fourth pitch. The first pitch is greater than the second pitch and the third pitch. The first shunt acoustic resonator has at least a first resonant frequency and a second resonant frequency. The acoustic wave filter can include series acoustic wave resonators. The series acoustic wave resonators and the shunt acoustic wave resonators are together arranged to filter a radio frequency signal.

In one embodiment, the second pitch and the third pitch are the same.

In one embodiment, the second pitch and the third pitch are different.

In one embodiment, the first pitch is 1% to 20% greater than the second pitch. The first pitch can be 10% to 20% greater than the second pitch.

In one embodiment, the first shunt acoustic wave resonator further includes a third interdigital transducer electrode that is positioned between the first interdigital transducer electrode and the second set of reflectors. The third interdigital transducer electrode can include fingers having a fifth pitch. The fifth pitch of the third interdigital transducer electrode can be different from the first pitch of the first interdigital transducer electrode.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/743,000, titled "MULTIMODE LONGITUDINALLY COUPLED SURFACE ACOUSTIC WAVE RESONATOR WITH MODULATED PITCH," filed on even date herewith, and U.S. patent application Ser. No. 17/743,3013, titled "SURFACE ACOUSTIC WAVE RESONATOR WITH ASYMMETRIC REFLECTORS," filed on even date herewith, the entire disclosure of which are hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
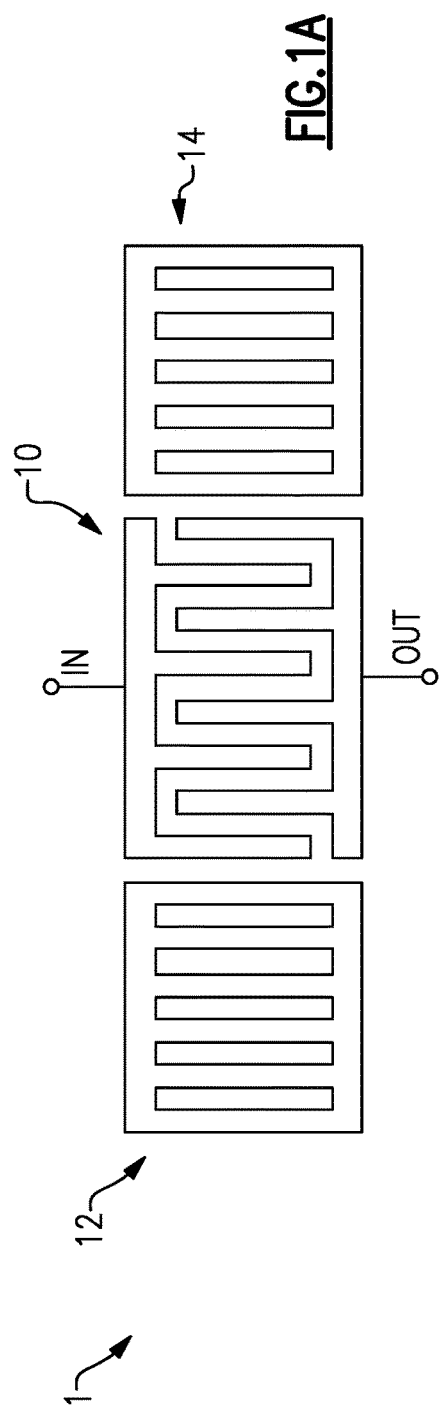
FIG. 1A illustrates a top plan view of a surface acoustic wave (SAW) resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. A SAW device can be, for example, a multimode longitudinally coupled SAW filter (e.g., a double mode SAW (DMS) filter) or a SAW resonator.

Filters with rejection over a relatively wide frequency range are desired for certain RF systems. Acoustic wave filters can include series acoustic wave resonators and shunt acoustic wave resonators. An anti-resonance frequency of a series acoustic wave resonator can be used for rejection in an acoustic wave filter. The anti-resonance frequency of the series acoustic wave resonator can create an open to thereby create a notch in a frequency response. A resonant frequency of a shunt acoustic wave resonator can be used for rejection in an acoustic wave filter. The resonant frequency of the shunt acoustic wave resonator can create a short to ground to thereby create a notch in a frequency response. The series acoustic wave resonator can have its highest conductance at the resonant frequency.

To achieve a relatively wide frequency range for rejection, an acoustic wave filter can include a plurality of shunt acoustic wave resonators each having a different resonant frequency. As an example, an acoustic wave filter can include 4 or 5 shunt acoustic wave resonators each having different respective resonant frequencies. With more shunt acoustic wave resonators having different resonant frequencies, the acoustic wave filter can achieve relatively higher rejection. At the same time, an acoustic wave filter with more acoustic wave resonators can consume additional area and/or cause an insertion loss degradation.

Aspects of this disclosure relate to an acoustic wave resonator having at least two resonant frequencies. The acoustic wave resonator can be arranged as a shunt resonator in an acoustic wave filter. Such a shunt resonator can achieve at least two notches and increase a frequency range for rejection of the acoustic wave filter. The acoustic wave filter can be a band pass filter with a pass band. For example, the acoustic wave resonator can have a second resonant frequency between a first resonant frequency and a lower edge of the pass band.

An acoustic wave device with at least two resonant frequencies can include an interdigital transducer (IDT) electrode with IDT fingers having a first pitch corresponding to a resonant frequency, and a pair of reflector structures that includes a first set of reflectors having a second pitch and a second set of reflectors having a third pitch. The acoustic wave device can be a surface acoustic wave (SAW) resonator. For example, the acoustic wave device can be a temperature compensated SAW resonator, a non-temperature compensated SAW resonator, or a multilayer piezoelectric substrate SAW resonator. In some embodiments, the first pitch can be greater than the second pitch and/or the third pitch. In some embodiments, a number of reflectors in the first set of reflectors and a number of reflectors in the second set of reflectors can be different. The number of reflectors in the first set of reflector and the second number of reflectors in the second set of reflectors can be determined based at least in part on a quality factor (Q) achieved by the acoustic wave device. In some embodiments, the first and second numbers can be selected such that the Q is greater than a certain value. For example the first and the second numbers can be selected so as to compensate for degradation of the Q due to having the first pitch greater than the second pitch. In some embodiments, the first and second numbers can be selected such that a reflection of the acoustic wave device is greater than a certain value for a frequency range from above a passband of a filter that includes the surface acoustic wave resonator. For example, the first and second numbers can be selected so as to compensate for degradation of the reflection of the acoustic wave device due to having the first pitch greater than the second pitch. In some embodiments, the acoustic wave device includes a multimode surface acoustic wave (MMS) resonator. The MMS resonator can include a second IDT electrode with IDT fingers having a fourth pitch and a third IDT electrode with IDT fingers having a fifth pitch. The first pitch, the fourth pitch, and the fifth pitch can be different, and be greater than the second pitch and/or the third pitch.

Though present disclosure may describe various features in connection with certain types of resonators, principles and advantages disclosed herein can be implemented in any suitable type of resonators, such as boundary wave resonators and/or Lamb wave resonators.

A shunt acoustic wave resonator with multiple resonant frequencies can improve out of band rejection for a filter without significantly degrading the filter response in a pass band. With a shunt acoustic wave resonator with multiple resonant frequencies, stringent rejection specifications can be met with fewer acoustic wave resonators than some previous solutions. Certain aspects of this disclosure can be particularly beneficial when a wider passband compared to the reflection band stopband width is desired, and/or a relatively low frequency resonance is desired to obtain a relatively wide rejection band.

Figure 1B:
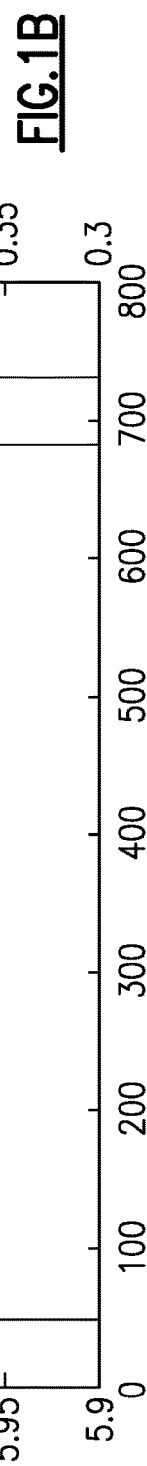
FIG. 1B illustrates a pitch profile of the SAW resonator of FIG. 1A.
Figure 1C:
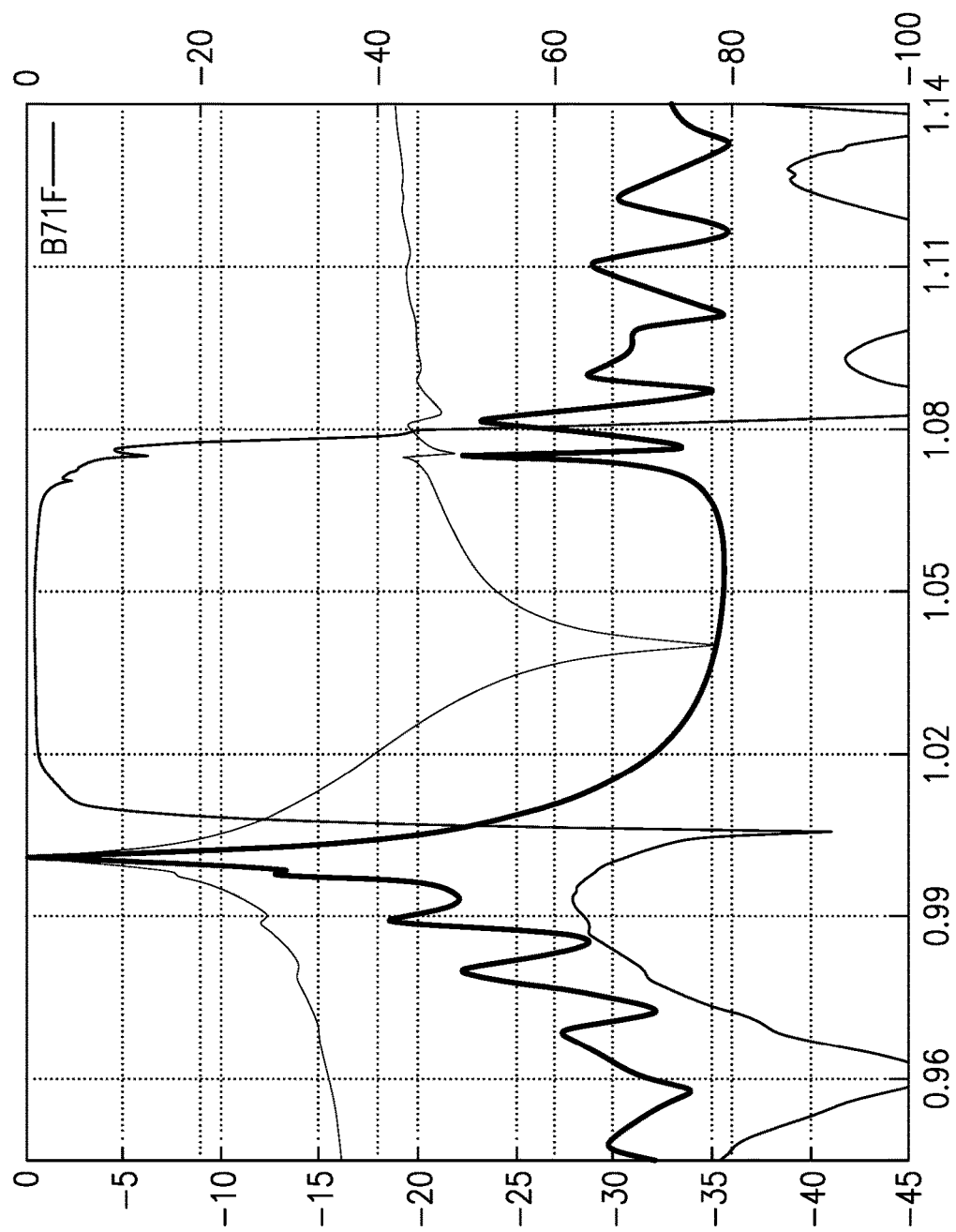
FIG. 1C is a graph that illustrates simulated results of the SAW resonator of FIG. 1A.

FIG. 1A illustrates a top plan view of a surface acoustic wave (SAW) resonator 1. FIG. 1B illustrates a pitch profile of the SAW resonator 1 shown in FIG. 1A. FIG. 1C is a graph that illustrates simulated results of the SAW resonator 1 of FIG. 1A when the SAW resonator 1 is used as a shunt resonator.

The SAW resonator 1 includes an IDT electrode 10 and a pair of reflector structures 12, 14. As shown in FIG. 1B, the IDT electrode 10 and the pair of reflector structures 12, 14 have the same pitches. Also, a number of reflectors in the pair of reflector structures are the same in the SAW resonator 1.

The simulated results in the graph of FIG. 1C includes simulated admittance result of the SAW resonator 1. A single resonance is observed from the graph. Therefore, the SAW resonator 1 is not suitable when at least two resonant frequencies are desired.

Figure 2A:
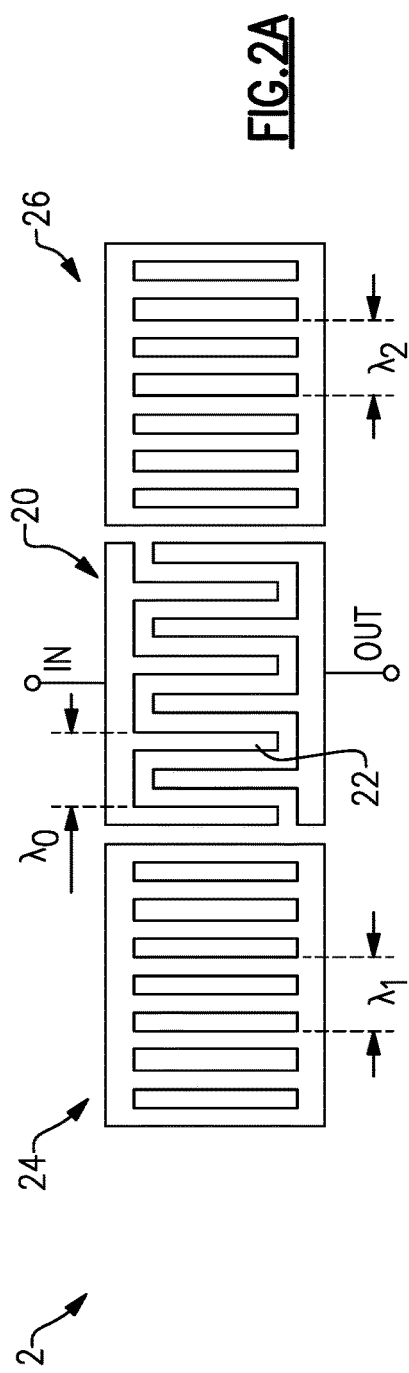
FIG. 2A illustrates a top plan view of a SAW resonator according to an embodiment.
Figure 2B:
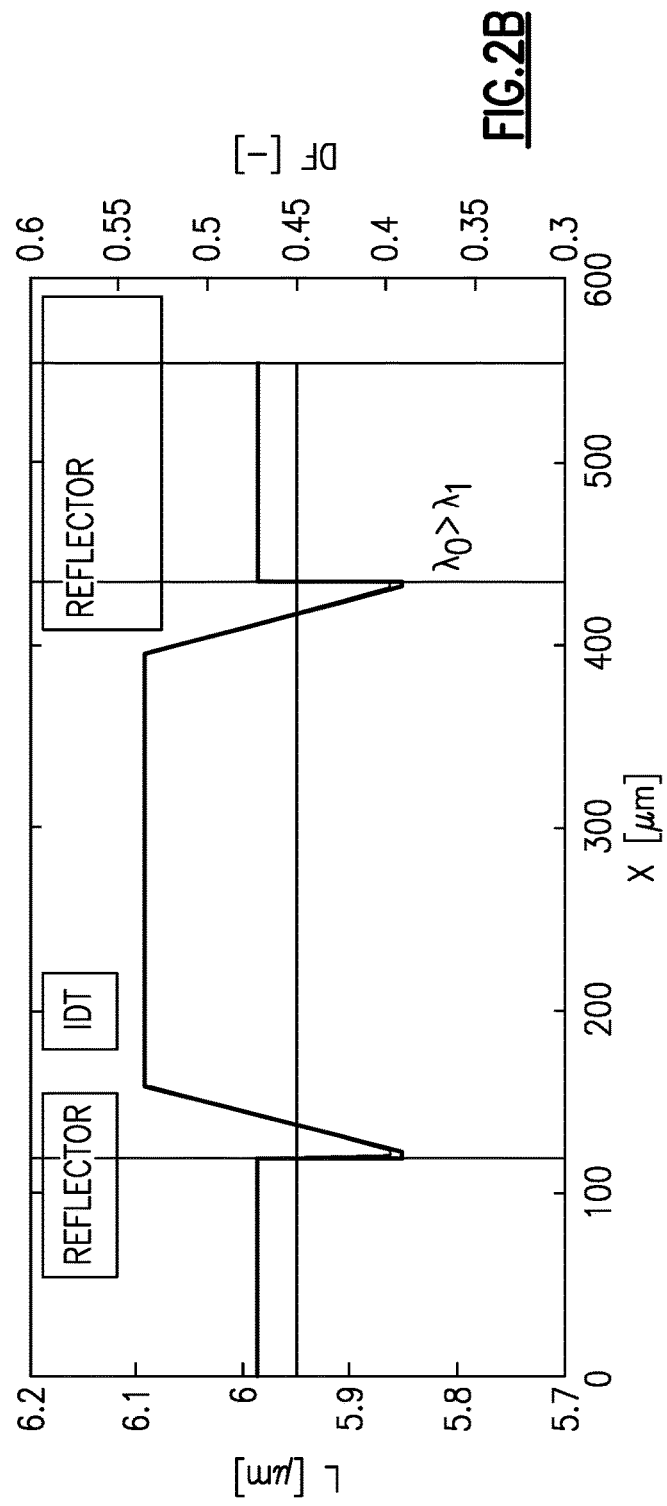
FIG. 2B illustrates a pitch profile of the SAW resonator shown in FIG. 2A.
Figure 2C:
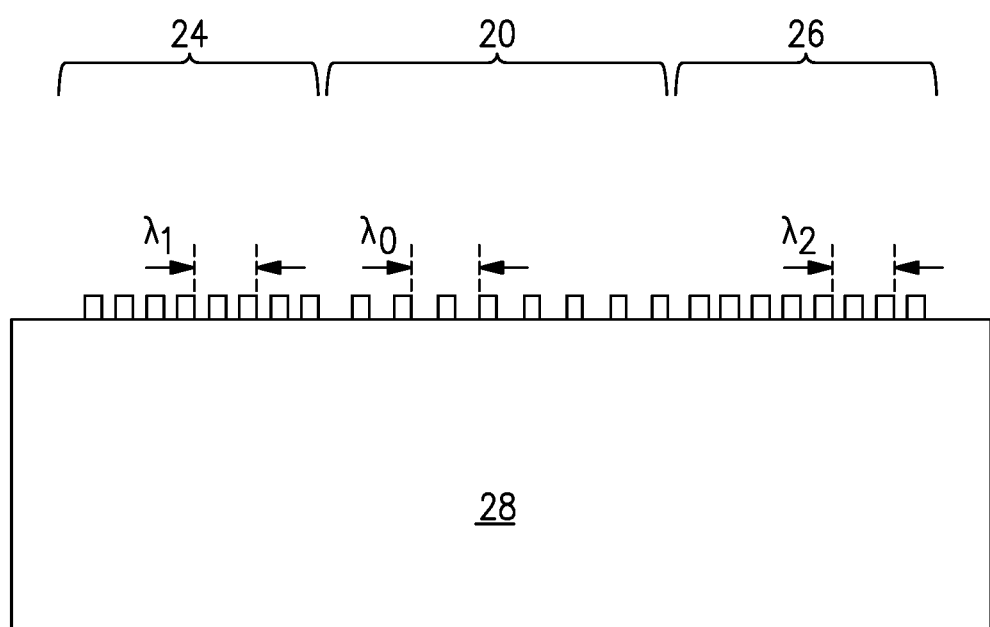
FIG. 2C illustrates a cross section of the SAW resonator of FIG. 2A.
Figure 2D:
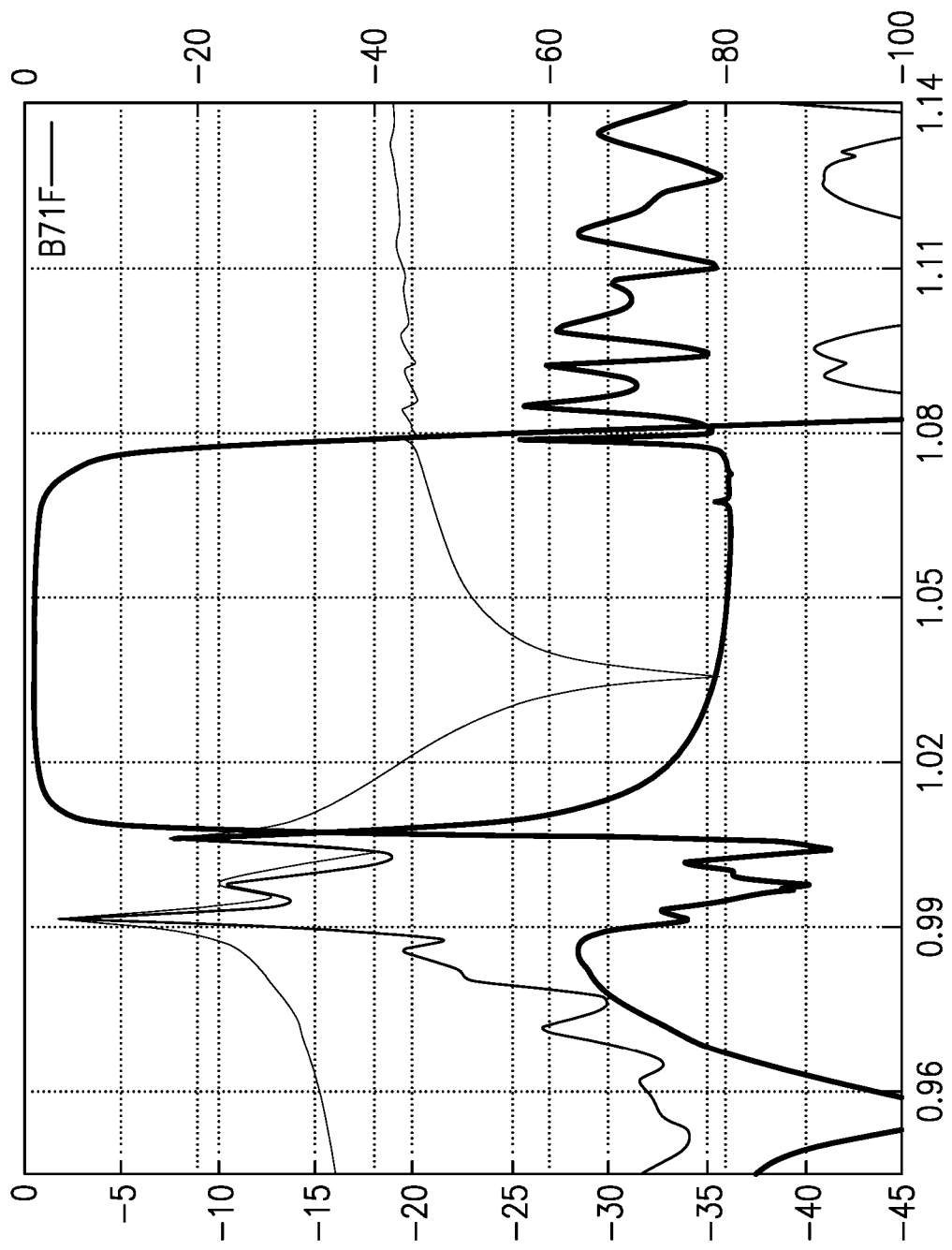
FIG. 2D is a graph that illustrates simulated results of the SAW resonator of FIG. 2A.

FIG. 2A illustrates a top plan view of a SAW resonator 2 according to an embodiment. FIG. 2B illustrates a pitch profile of the SAW resonator 1 shown in FIG. 2A. FIG. 2C illustrates a cross section of the SAW resonator 2 of FIG. 2A. FIG. 2D is a graph that illustrates simulated results of the SAW resonator 2 of FIG. 2A when the SAW resonator 3 is used as a shunt resonator.

The SAW resonator 2 can include an interdigital transducer (IDT) electrode 20 with IDT fingers 22 having a first pitch ($\lambda_0$) corresponding to a resonant frequency, and a pair of reflector structures that includes a first set of reflectors 24 having a second pitch ($\lambda_1$) and a second set of reflectors 26 having a third pitch ($\lambda_2$). The IDT electrode 20, the first set of reflectors 24, and the second set of reflectors 26 can be positioned over a piezoelectric layer 28. In the illustrated embodiment, the first pitch ($\lambda_0$) is greater than the second pitch ($\lambda_1$) and the third pitch ($\lambda_2$). A number of reflectors in the first set of reflectors 24 and a number of reflectors in the second set of reflectors 26 can be greater than a number of reflectors in the SAW resonator 1 shown in FIG. 1A.

The IDT electrode 20 can include any suitable material. For example, the IDT electrode 20 can include tungsten (W), aluminum (Al), copper (Cu), magnesium (Mg), titanium (Ti), molybdenum (Mo), the like, or any suitable combination thereof. The IDT electrode 20 may include alloys, such as AlMgCu, AlCu, etc. The first set of reflectors 24 and the second set of reflectors 26 can include any suitable material. For example, the first set of reflectors 24 and the second set of reflectors 26 can include tungsten (W), aluminum (Al), copper (Cu), magnesium (Mg), titanium (Ti), molybdenum (Mo), the like, or any suitable combination thereof. The first set of reflectors 24 and the second set of reflectors 26 may include alloys, such as AlMgCu, AlCu, etc. In some embodiments, one or more of the first IDT electrode 20, the first set of reflectors 24, and/or the second set of reflectors 26 can have a multi-layer structure.

The piezoelectric layer 28 can include any suitable piezoelectric layer, such as a lithium niobate (LN) layer or a lithium tantalate (LT) layer. A thickness of the piezoelectric layer 28 can be selected based on a wavelength λ or L of a surface acoustic wave generated by the SAW resonator 2.

By having the second pitch ($\lambda_1$) and the third pitch ($\lambda_2$) of the reflector structures narrower than the first pitch ($\lambda_0$) of the IDT electrode 20, an additional resonance can be generated by a reflector side, as shown in the graph of FIG. 2D. In the frequency response of the SAW resonator 2, two notches can be present as opposed to the one notch present in the frequency response of the SAW resonator 1. The first to third pitches ($\lambda_0$), ($\lambda_1$), ($\lambda_2$) can contribute to shifting a notch in the frequency response. For example, when the second pitch ($\lambda_1$) and the third pitch ($\lambda_2$) of the reflector structures are narrowed, the higher resonance can be shifted up to a higher frequency. Accordingly, the first to third pitches ($\lambda_0$), ($\lambda_1$), ($\lambda_2$) can be selected at least in part by the desired response frequency. For example, a difference between the second pitch ($\lambda_1$) and/or the third pitch ($\lambda_2$), and the first pitch ($\lambda_0$) can relate to a difference between the main resonance and the reflector sub-resonance. In some embodiments, the second pitch ($\lambda_1$) and the third pitch ($\lambda_2$) can be different. By varying the second pitch ($\lambda_1$) and the third pitch ($\lambda_2$), additional notches can be obtained in the frequency response.

In some embodiments, the first pitch ($\lambda_0$) can be greater than the second pitch ($\lambda_1$) and the third pitch ($\lambda_2$), and be less than 120% of the second pitch ($\lambda_1$) and/or the third pitch ($\lambda_2$). For example, the first pitch ($\lambda_0$) can be about 1% to 20%, about 10% to 20%, or about 15% to 20% greater than the second pitch ($\lambda_1$) and/or the third pitch ($\lambda_2$). The second pitch ($\lambda_1$) and the third pitch ($\lambda_2$) can be sufficiently wide so as to prevent a significant degradation of a main resonance peak. The second pitch ($\lambda_1$) and the third pitch ($\lambda_2$) can be determined based at least in part on manufacturing limitations for forming the reflectors.

The number of reflectors in the first set of reflectors 24 and the number of reflectors in the second set of reflectors 26 can affect reflection of the SAW resonator 2 and/or the Q in the frequency response of the SAW resonator 2. A material property (e.g., mass density) of the first set of reflectors 24 and the second set of reflectors 26 can affect the reflection of the SAW resonator 2 and/or the Q in the frequency response of the SAW resonator 2. For example, when the SAW resonator 2 has more numbers of the first set of reflectors 24 and the second set of reflectors 26, a deeper drop in the notch(es) can be generated in the frequency response. When the reflection is 1 or 100%, a gamma value can be 1. Therefore, typically, a higher reflection can be desired for a one port resonator. However, it may be challenging to obtain 100% of reflection when the filter pass band is relatively wide. Accordingly, the first set of reflectors 24 and the second set of reflectors 26 can be designed based at least in part on desired frequency response.

The simulated results in the graph of FIG. 2D include simulated admittance result of the SAW resonator 1. Two resonances are observed from the graph. Therefore, the SAW resonator 2 can be suitable when at least two resonant frequencies are desired. Also, as compared to the graph of FIG. 1C, in the graph of FIG. 2D, it can be observed that the reflector stop band is shifted higher and larger margin at high-edge of passband is present. As described above, first to third pitches ($\lambda_0$), ($\lambda_1$), ($\lambda_2$) and the number of reflectors of the first set of reflectors 24 and the second set of reflectors 26 can be selected to achieve two or more resonant frequencies while achieving a relatively high Q.

Figure 3:
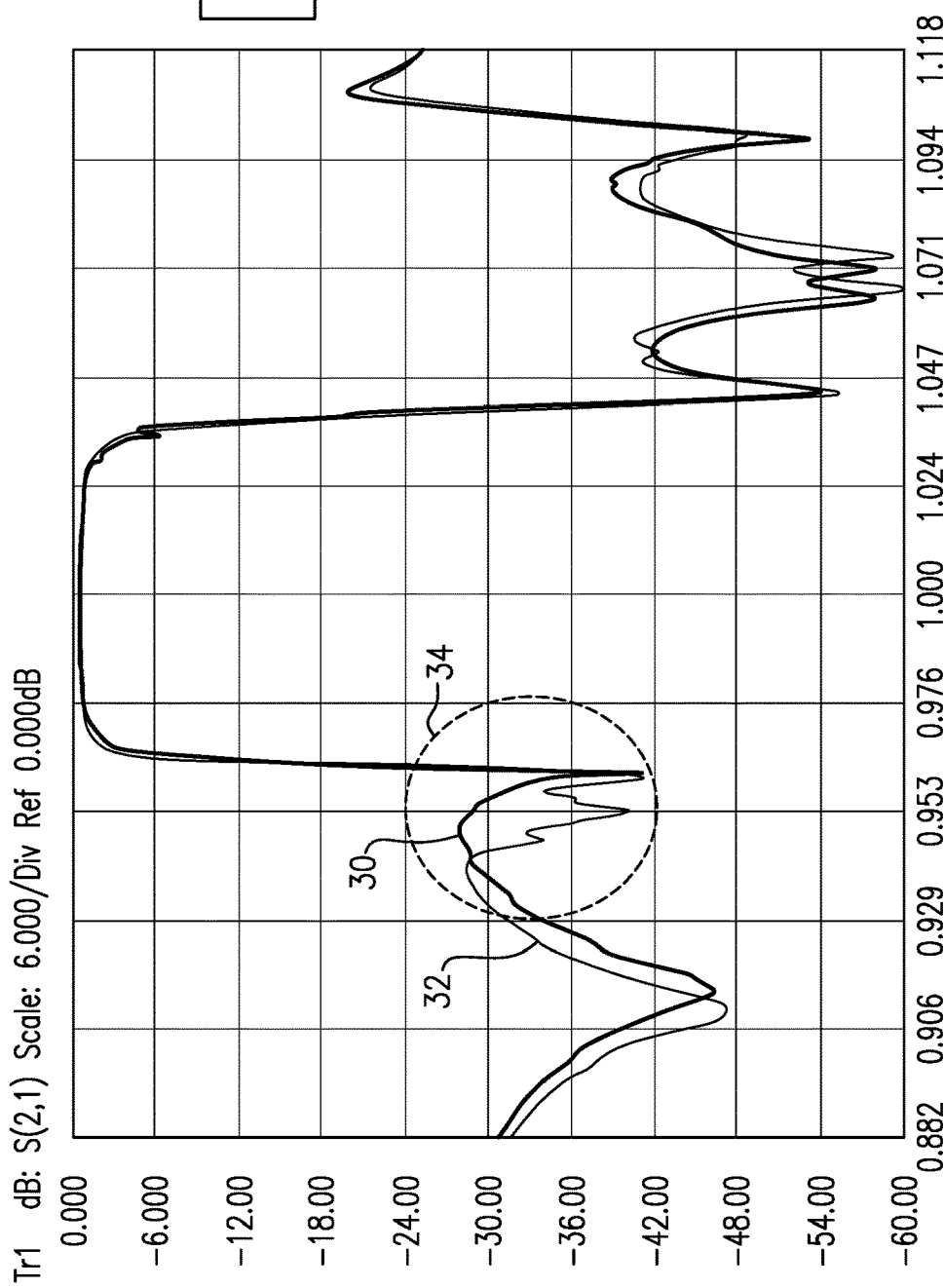
FIG. 3 is a graph that illustrates simulated frequency responses of the SAW resonator of FIG. 1A and the SAW resonator of FIG. 2A.

FIG. 3 is a graph that compares a simulated frequency response 30 of the SAW resonator 1 of FIG. 1A and a simulated frequency response 32 of the SAW resonator 2 of FIG. 2A used as shunt resonators in a ladder band pass filter. In an area indicated by a dashed line 34 in FIG. 3, the simulated frequency response 32 of the SAW resonator 2 shows that the SAW resonator 2 achieves two frequencies in the transmit rejection. Conventionally, in order to achieve two or more resonance frequencies, two or more different types of resonators were used. Using two or more types of resonators, especially when the filter pass band is larger, may cause spurious mode which degrades the filter performance. However, the SAW resonator 2 can achieve two or more resonance frequencies in the transmit rejection without a significant degradation of the Q as compared to the SAW resonator 1.

Various embodiments of SAW devices will now be discussed with reference to FIGS. 4 to 6. Any suitable principles and advantages of the SAW devices disclosed herein can be implemented together with each other.

Figure 4:
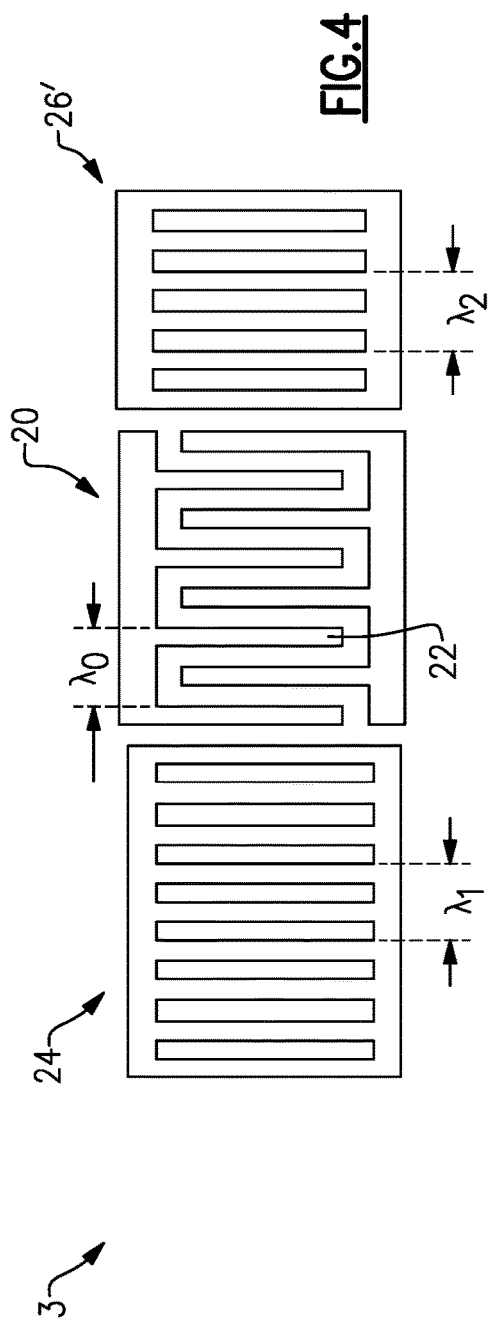
FIG. 4 illustrates a top plan view of a SAW resonator according to another embodiment.

FIG. 4 illustrates a top plan view of a SAW resonator 3 according to another embodiment. Unless otherwise noted, components of the SAW resonator 3 may be the same or generally similar to like components of any surface acoustic wave resonator disclosed herein.

The SAW resonator 3 is generally similar to the SAW resonator 2 illustrated in FIG. 2A. Unlike the SAW resonator 2, the SAW resonator 3 has an asymmetric reflector structure. In the SAW resonator 3, a number of reflectors of a first set of reflectors 24 is greater than a number of reflectors of a second set of reflectors 26'. By varying the numbers of the reflectors in of the first set of reflectors 24 and the second set of reflectors 26', additional notches can be obtained in the frequency response. The number of reflectors of the first set of reflectors 24 in the SAW resonators 2, 3 are kept the same, and the number of the second set of reflectors 26' of the SAW resonator 3 is fewer than the number of second set of reflectors 26 of SAW resonator 2 in the illustrated embodiments. However, any suitable number of reflectors can be selected.

IDT fingers 22 of an IDT electrode 20 has a first pitch ($\lambda_0$) corresponding to a resonant frequency, the first set of reflectors 24 has a second pitch ($\lambda_1$), and a second set of reflectors 26 has a third pitch ($\lambda_2$). The second pitch ($\lambda_1$) and the third pitch ($\lambda_2$) can be the same or different. In some embodiments, the first pitch ($\lambda_0$) is greater than the second pitch ($\lambda_1$) and the third pitch ($\lambda_2$).

Figure 5:
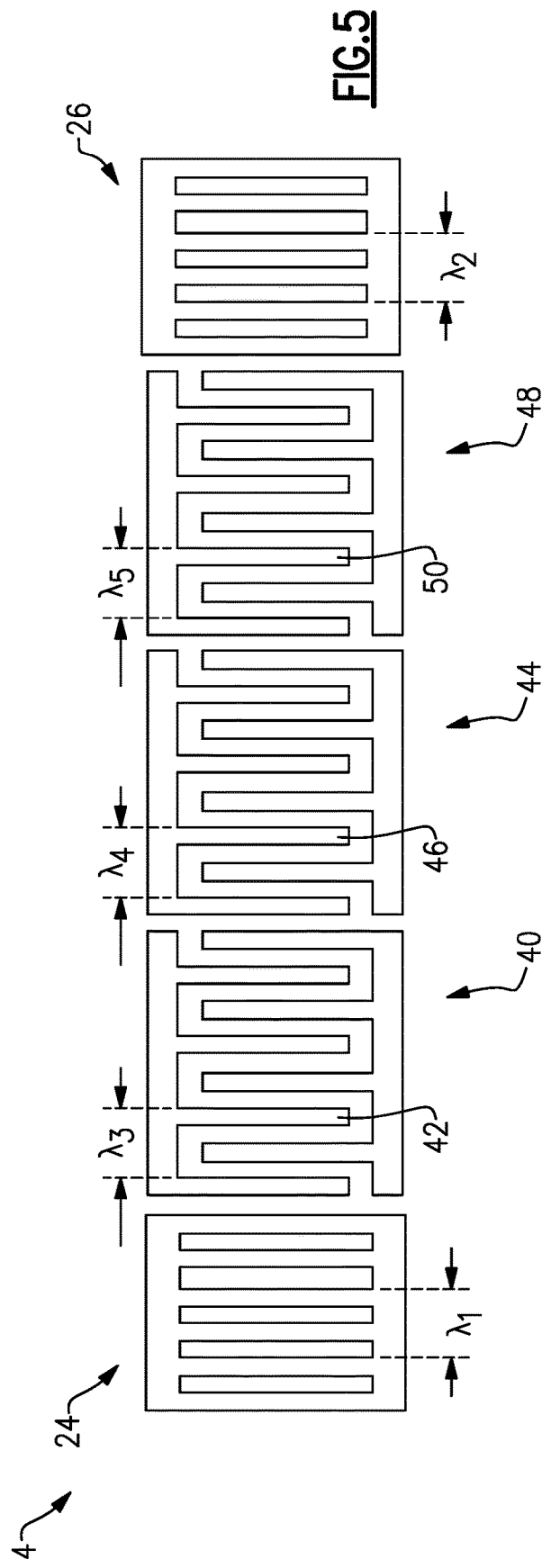
FIG. 5 illustrates a top plan view of a SAW resonator according to another embodiment.

FIG. 5 illustrates a top plan view of a multimode longitudinally coupled SAW (MMS) resonator 4 according to an embodiment. Unless otherwise noted, components of the MMS resonator 4 may be the same or generally similar to like components of any surface acoustic wave resonator disclosed herein.

The MMS resonator 4 can be a double mode SAW (DMS) filter. The MMS resonator 4 can include a first IDT electrode 40 with IDT fingers 42 having a fourth pitch ($\lambda_3$) corresponding to a resonant frequency, a second IDT electrode 44 with IDT fingers 46 having a fifth pitch ($\lambda_4$) corresponding to a resonant frequency, a third IDT electrode 48 with IDT fingers 50 having a sixth pitch ($\lambda_5$) corresponding to a resonant frequency, and a pair of reflector structures that includes a first set of reflectors 24 having a second pitch ($\lambda_1$) and a second set of reflectors 26 having a third pitch ($\lambda_2$). The second pitch ($\lambda_1$) and the third pitch ($\lambda_2$) can be the same or different. The fourth pitch ($\lambda_3$), the fifth pitch ($\lambda_4$), and sixth pitch ($\lambda_5$) can be the same or different. In some embodiments, at least one of the fourth pitch ($\lambda_3$), the fifth pitch ($\lambda_4$), and sixth pitch ($\lambda_5$) can be greater than the second pitch ($\lambda_1$) and/or the third pitch ($\lambda_2$). In some embodiments, the MMS resonator 4 can have an asymmetric reflector structure.

Figure 6:
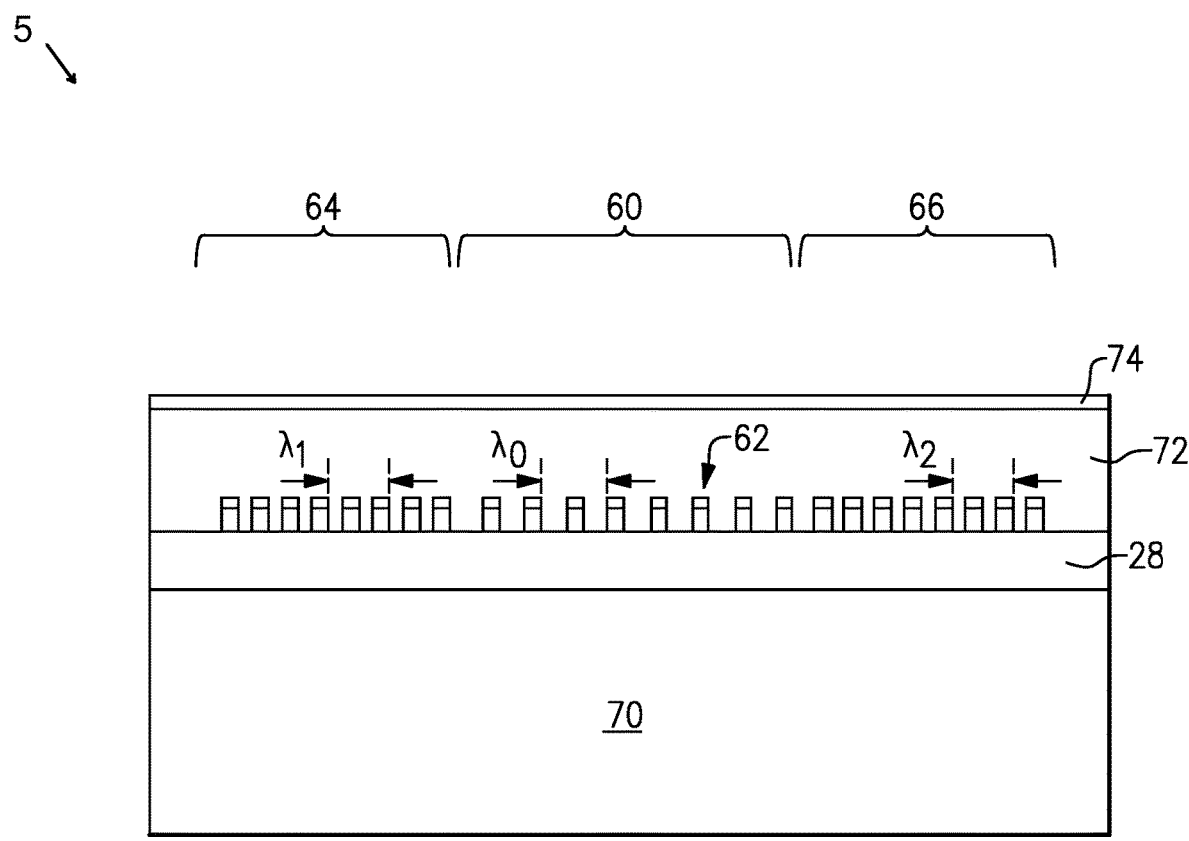
FIG. 6 illustrates a cross section of a SAW resonator according to an embodiment.

FIG. 6 illustrates a cross section of a temperature compensated surface acoustic wave TC-SAW resonator 5 according to an embodiment. Unless otherwise noted, components of the SAW resonator 3 may be the same or generally similar to like components of any surface acoustic wave resonator disclosed herein.

The TC-SAW resonator 5 can include an interdigital transducer (IDT) electrode 60 with IDT fingers 62 having a first pitch ($\lambda_0$) corresponding to a resonant frequency, and a pair of reflector structures that includes a first set of reflectors 64 having a second pitch ($\lambda_1$) and a second set of reflectors 66 having a third pitch ($\lambda_2$). The IDT electrode 60, the first set of reflectors 64, and the second set of reflectors 66 can be positioned over a piezoelectric layer 28. The piezoelectric layer 28 can be positioned over a support substrate 70. A temperature compensation layer 72 can be provided over the piezoelectric layer 28. A dispersion adjustment layer 74 can be provided over the temperature compensation layer 72. In some embodiments, there may be an intermediate layer (not shown) between the piezoelectric layer 28 and the support substrate 70.

As show in FIG. 6, the IDT electrode 60 and the reflectors 64, 66 can have multiple layers of different materials. For example, one layer (e.g., a bottom layer) can be tungsten (W) and another layer (e.g., an upper layer) can be aluminum (Al) in certain embodiments. As another example, the lower layer can be aluminum (Al) and the upper layer can be tungsten (W), in certain embodiments. The bottom layer may include one or more other metals, such as copper (Cu), Magnesium (Mg), titanium (Ti), molybdenum (Mo), etc. The bottom layer may include alloys, such as AlMgCu, AlCu, etc. The upper layer may include one or more other metals, such as copper (Cu), Magnesium (Mg), titanium (Ti), molybdenum (Mo), etc. The upper layer may include alloys, such as AlMgCu, AlCu, etc. In some applications, the bottom layer of the IDT electrode 60 can impact acoustic properties of the TC-SAW resonator and the upper layer of the IDT electrode 60 can impact electrical properties of the SAW resonator, in some embodiments.

The support substrate 70 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like.

The temperature compensation layer 72 can include any suitable temperature compensation material. For example, the temperature compensation layer 72 can be a silicon dioxide ($SiO_2$) layer. The temperature compensation layer 72 can be a layer of any other suitable material having a positive temperature coefficient of frequency for SAW resonators with a piezoelectric layer having a negative coefficient of frequency. For instance, the temperature compensation layer 72 can be a tellurium dioxide ($TeO_2$) layer or a silicon oxyfluoride (SiOF) layer in certain applications. The temperature compensation layer 72 can include any suitable combination of $SiO_2$, $TeO_2$, and/or SiOF.

The dispersion adjustment layer 74 can be a SiN layer disposed entirely over an upper surface of the temperature compensation layer 72. However, the dispersion adjustment layer 74 may be partially disposed over the upper surface of the temperature compensation layer 72. In certain applications, the dispersion adjustment layer 74 can include another suitable material, such as a silicon oxynitride (SiON) layer. According to some applications, the dispersion adjustment layer can include SiN and another material. The dispersion adjustment layer 74 can also function as a passivation layer.

An MMS filter, a SAW resonator, and/or a lamb wave device including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS SAW resonators disclosed herein. FR1 can be from 410 MHz to 7.125 GHz, for example, as specified in a current 5G NR specification. MMS filters disclosed herein can be implemented with less pitch variation than some previous MMS filters. MMS filters disclosed herein can filter higher frequency signals with the same IDT electrode line and space process limitations compared to some previous MMS filters. Filtering higher frequency signals can be advantageous in 5G applications. One or more MMS filters and/or SAW resonators in accordance with any suitable principles and advantages disclosed herein can be included in a filter arranged to filter a radio frequency signal in a fourth generation (4G) Long Term Evolution (LTE) operating band and/or in a filter having a passband that includes a 4G LTE operating band and a 5G NR operating band.

Figure 7:
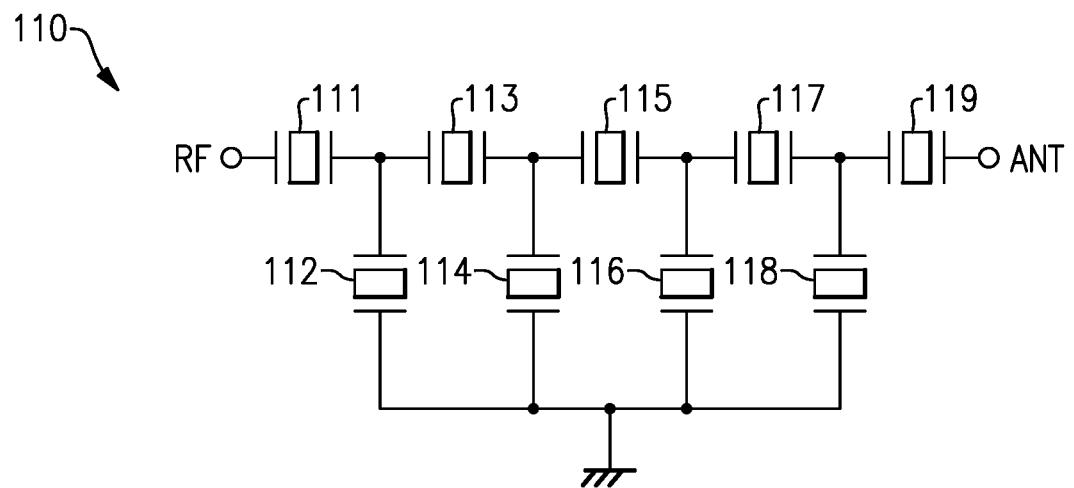
FIG. 7 is a schematic diagram of a ladder filter that includes a shunt resonator according to an embodiment.

Acoustic wave filters disclosed herein can have a ladder filter topology. FIG. 7 is a schematic diagram of a ladder filter 110 that includes a shunt resonator according to an embodiment. The ladder filter 110 is an example topology of a band pass filter formed from acoustic wave resonators. In a band pass filter with a ladder filter topology, the shunt resonators can have lower resonant frequencies than the series resonators. The ladder filter 110 can be arranged to filter an RF signal. As illustrated, the ladder filter 110 includes series acoustic wave resonators 111, 113, 115, 117, and 119 and shunt acoustic wave resonators 112, 114, 116, and 118 coupled between an RF port RF and an antenna port ANT. The acoustic wave resonators of the ladder filter 110 can include any suitable acoustic wave resonators. The RF port can be a transmit port for a transmit filter or a receive port for a receive filter. Any suitable number of series acoustic wave resonators can be included in a ladder filter. Any suitable number of shunt acoustic wave resonators can be included in a ladder filter. Any of the illustrated shunt acoustic wave resonators 112, 114, 116, and 118 can have multiple resonant frequencies in accordance with any suitable principles and advantages disclosed herein. In certain instances, a single shunt resonator of the ladder filter 110 has multiple resonant frequencies in accordance with any suitable principles and advantages disclosed herein. In some other instances, two or more shunt resonators of the ladder filter 110 can have multiple resonant frequencies in accordance with any suitable principles and advantages disclosed herein.

Figure 8:
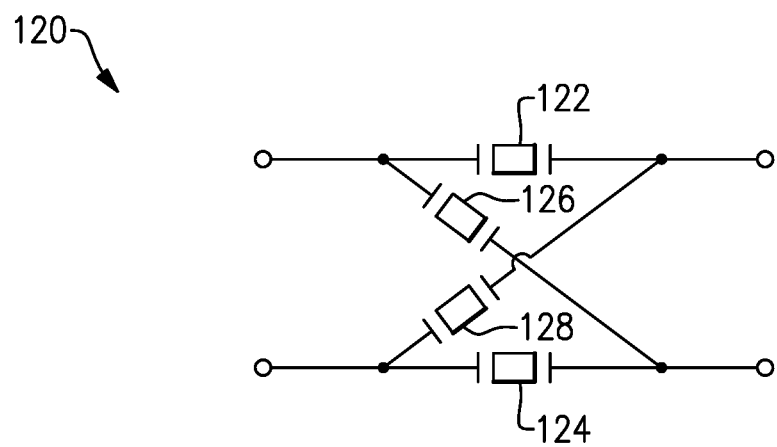
FIG. 8 is a schematic diagram of a lattice filter that includes a resonator according to an embodiment.

Acoustic wave filters disclosed herein can have a lattice filter topology. FIG. 8 is a schematic diagram of a lattice filter 120 that includes a resonator according to an embodiment. The lattice filter 120 is an example topology of a band pass filter formed from acoustic wave resonators. The lattice filter 120 can be arranged to filter an RF signal. As illustrated, the lattice filter 120 includes acoustic wave resonators 122, 124, 126, and 128. The acoustic wave resonators 122 and 124 are considered series resonators. The acoustic wave resonators 126 and 128 are considered shunt resonators. The illustrated lattice filter 120 has a balanced input and a balanced output. The illustrated acoustic wave resonators 126 and/or 128 can have multiple resonant frequencies in accordance with any suitable principles and advantages disclosed herein.

In some instances, an acoustic wave filter that includes a shunt resonator having two or more resonant frequencies can have a topology that is a hybrid of a ladder filter and a lattice filter. According to certain applications, an acoustic wave shunt resonator having two or more resonant frequencies can be included in filter that also includes one or more inductors and one or more capacitors.

Figure 9:
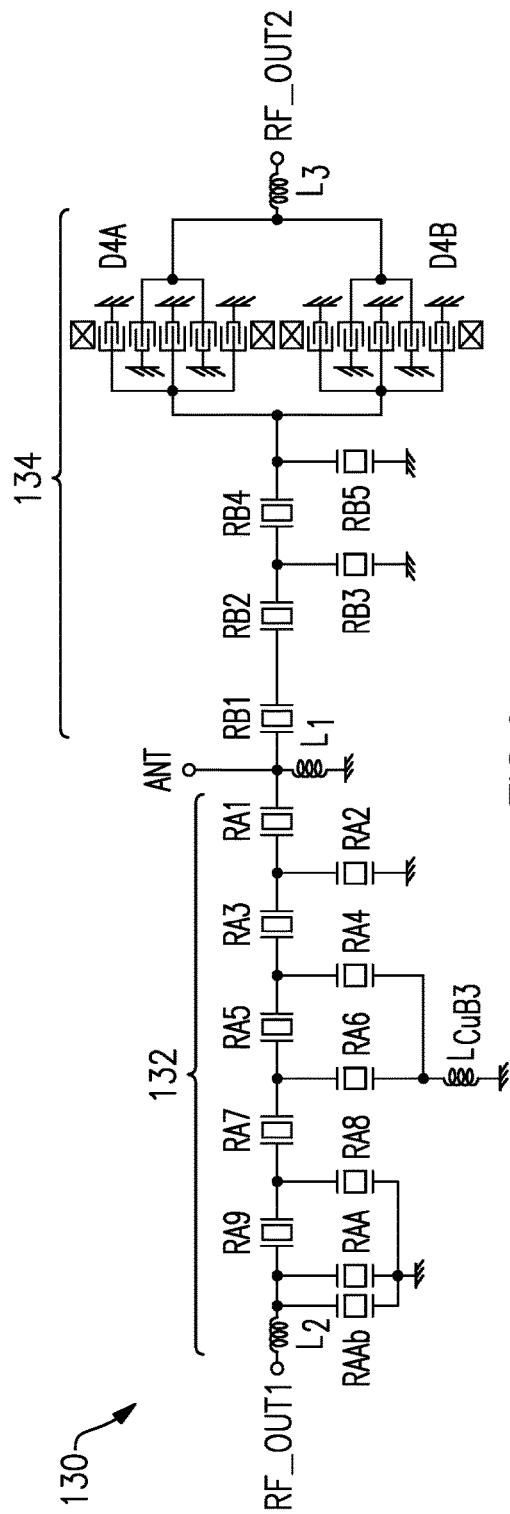
FIG. 9 is a schematic diagram of a duplexer according to an embodiment.

FIG. 9 is a schematic diagram of a duplexer 130 according to an embodiment. The duplexer 130 includes a first filter 132 and a second filter 134 coupled together at an antenna node ANT. The antenna node ANT is a common node of the duplexer 130. A shunt inductor L1 is also coupled to the first filter 132 and the second filter 134 at the antenna node ANT. The duplexer 130 can be a diversity receive duplexer in which the first filter 132 is a receive filter and the second filter 134 is a receive filter. As an illustrative example, the first filter 132 can be a Band 3 receive filter and the second filter 134 can be a Band 66 receive filter.

The first filter 132 includes a plurality of acoustic wave resonators. As illustrated, the first filter 132 is a ladder filter. The acoustic wave resonators of the first filter 132 include series resonators RA1, RA3, RA5, RA7, and RA9 and shunt resonators RA2, RA4, RA6, RA8, RAA, and RAAb. One or more of the shunt resonators RA2, RA4, RA6, RA8, RAA, and RAAb can have a plurality of resonant frequencies. The first filter 132 also includes a series inductor L2 coupled between the plurality of acoustic wave resonators and an RF port RF_OUT1. The first filter 132 includes a shunt inductor LCuB3. In certain applications, the first filter 132 can have the frequency response similar to that shown in FIG. 2D. In such applications, the shunt resonator RA2 can have two resonant frequencies corresponding to the curve in FIG. 2D.

The second filter 134 includes a plurality of acoustic wave resonators. The acoustic wave resonators of the second filter 134 include series resonators RB1, RB2, and RB4, shunt resonators RB3 and RB5, and double mode SAW (DMS) elements D4A and D4B. The shunt resonator RB3 and/or the shunt resonator RB4 can have a plurality of resonant frequencies in accordance with any suitable principles and advantages disclosed herein in certain embodiments. The second filter 134 also includes a series inductor L3 coupled between the plurality of acoustic wave resonators and an RF port RF_OUT2.

Figure 10:
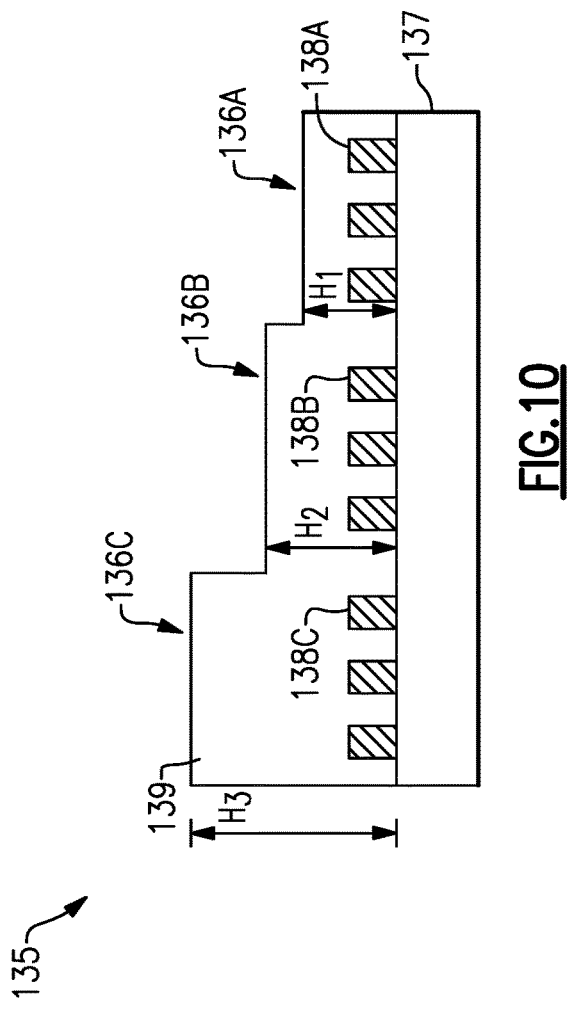
FIG. 10 is a schematic diagram of a cross section of surface acoustic wave resonators of the duplexer of FIG. 9 according to an embodiment.

Acoustic wave resonators of the duplexer 130 can be TC-SAW resonators. Such TC-SAW resonators can have temperature compensation layers of different thicknesses. FIG. 10 is a schematic diagram of a cross section of surface acoustic wave resonators of the duplexer 130 of FIG. 9 according to an embodiment. As shown in FIG. 10, an acoustic wave component 135 includes TC-SAW resonators 136A, 136B, and 136C. One or more of the TC-SAW resonators 136A, 136B, and 136C can have two or more resonant frequencies in accordance with any suitable principles and advantages disclosed herein. The acoustic wave component 135 includes a piezoelectric layer 137 and IDT electrodes 138A, 138B, and 138C on the piezoelectric layer 137. A temperature compensation layer 139 is positioned over the IDT electrodes 138A, 138B, and 138C and the piezoelectric layer 137. The piezoelectric layer 137 can be a lithium niobate layer. The temperature compensation layer 139 can be a silicon dioxide layer.

The temperature compensation layer 139 has a plurality of different thicknesses over respective IDT electrodes 138A, 138B, and 138C. The temperature compensation layer 139 being thicker can result in TCF closer to zero and lower Q and electromechanical coupling coefficient ($k^2$). The temperature compensation layer 139 can be have different thicknesses such that certain resonators have TCF closer to zero and other resonators have higher Q and $k^2$. The first TC-SAW resonator 136A has a first thickness H1 of the temperature compensation layer 139 over the piezoelectric layer 137. The second TC-SAW resonator 136B has a second thickness H2 of the temperature compensation layer 139 over the piezoelectric layer 137. The third TC-SAW resonator 136C has a third thickness H3 of the temperature compensation layer 139 over the piezoelectric layer 137. As shown in FIG. 10, the third thickness H3 is greater than the second thickness H2 and the second thickness H2 is greater than the first thickness H1.

In an embodiment of the duplexer 130, acoustic wave resonators RA1, RB1, RB2, RB4 can be TC-SAW resonators with the first thickness H1 like the TC-SAW resonator 136A, acoustic wave resonators RA7, RA9, RB3, and RB5 can be TC-SAW resonators with the second thickness H2 like the TC-SAW resonator 136B, and acoustic wave resonators RA2, RA3, RA4, RA5, RA6, RA8, RAA, and RAAb can be TCSAW resonators with the third thickness H3 like the TC-SAW resonator 136C.

Figure 11A:
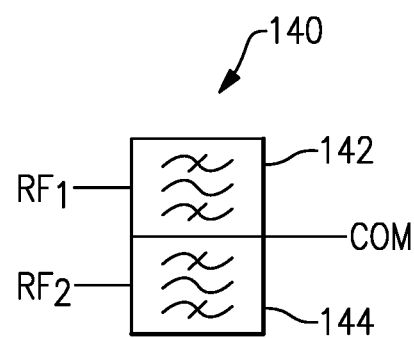
FIG. 11A is a schematic diagram of a duplexer that includes an acoustic wave filter according to an embodiment.

FIG. 11A is a schematic diagram of a duplexer 140 that includes an acoustic wave filter according to an embodiment. The duplexer 140 includes a first filter 142 and a second filter 144 coupled together at a common node COM. One of the filters of the duplexer 140 can be a transmit filter and the other of the filters of the duplexer 140 can be a receive filter. The transmit filter and the receive filter can be respective ladder filters with acoustic wave resonators having a topology similar to the ladder filter 110 of FIG. 7. In some other instances, such as in a diversity receive application, the duplexer 140 can include two receive filters. The common node COM can be an antenna node.

The first filter 142 is an acoustic wave filter arranged to filter a radio frequency signal. The first filter 142 can include acoustic wave resonators coupled between a first radio frequency node RF1 and the common node. The first radio frequency node RF1 can be a transmit node or a receive node. The first filter 142 includes a shunt acoustic wave resonator having multiple resonant frequencies in accordance with any suitable principles and advantages disclosed herein.

The second filter 144 can be any suitable filter arranged to filter a second radio frequency signal. The second filter 144 can be, for example, an acoustic wave filter, an acoustic wave filter that includes shunt resonator with multiple resonant frequencies, an LC filter, a hybrid acoustic wave LC filter, or the like. The second filter 144 is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include a shunt acoustic wave resonator having multiple resonant frequencies. Multiplexers include multiplexers with fixed multiplexing and multiplexers with switched multiplexing.

Figure 11B:
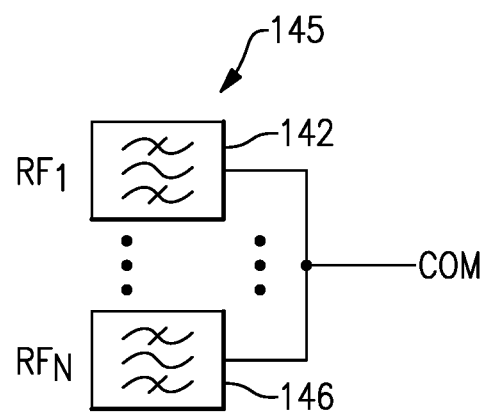
FIG. 11B is a schematic diagram of a multiplexer that includes an acoustic wave filter according to an embodiment.

FIG. 11B is a schematic diagram of a multiplexer 145 that includes an acoustic wave filter according to an embodiment. The multiplexer 145 includes a plurality of filters 142 to 144 coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters.

The first filter 142 is an acoustic wave filter arranged to filter a radio frequency signal. The first filter 142 can include acoustic wave resonators coupled between a first radio frequency node RF1 and the common node. The first radio frequency node RF1 can be a transmit node or a receive node. The first filter 142 includes a shunt acoustic wave resonator having multiple resonant frequencies in accordance with any suitable principles and advantages disclosed herein. The other filter(s) of the multiplexer 145 can include one or more acoustic wave filters, one or more acoustic wave filters that include a shunt resonator with multiple resonant frequencies, one or more LC filters, one or more hybrid acoustic wave LC filters, or any suitable combination thereof.

The acoustic wave resonators with multiple resonant frequencies disclosed herein can be implemented in a variety of packaged modules. Some example packaged modules will now be disclosed in which any suitable principles and advantages of the acoustic wave filters and/or acoustic wave resonators disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 12 to 15 are schematic block diagrams of illustrative packaged modules according to certain embodiments. Any suitable combination of features of these packaged modules can be implemented with each other. While duplexers are illustrated in the example packaged modules of FIGS. 13 to 15, any other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 12:
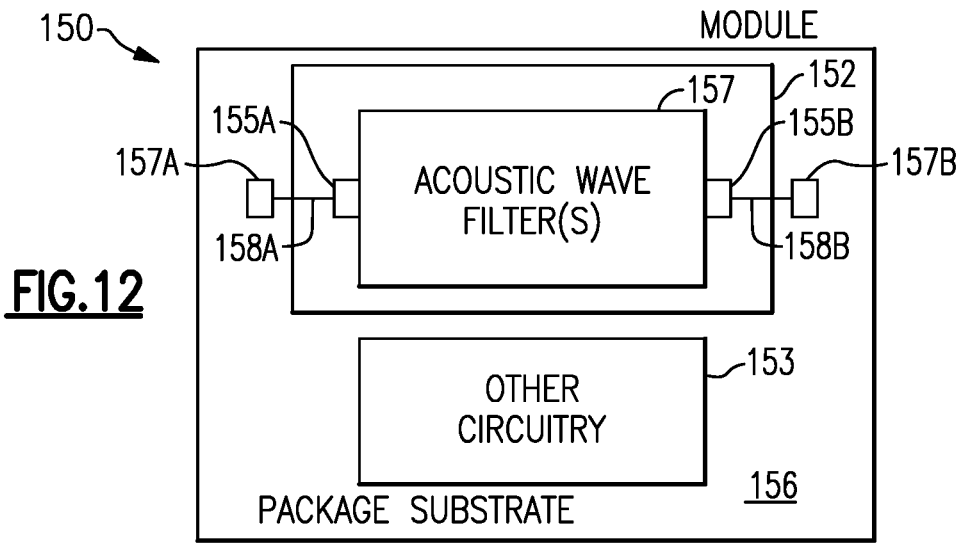
FIG. 12 is a schematic diagram of a radio frequency module that includes an acoustic wave filter according to an embodiment.

FIG. 12 is a schematic diagram of a radio frequency module 150 that includes an acoustic wave component 152 according to an embodiment. The illustrated radio frequency module 150 includes the acoustic wave component 152 and other circuitry 153. The acoustic wave component 152 can include one or more acoustic wave in accordance with any suitable combination of features of the acoustic wave filters and/or acoustic wave resonators disclosed herein. The acoustic wave component 152 can include a SAW die that includes SAW resonators, for example.

The acoustic wave component 152 shown in FIG. 12 includes one or more acoustic wave filters 154 and terminals 155A and 155B. The one or more acoustic wave filters 154 can include an acoustic wave resonator having multiple resonant frequencies implemented in accordance with any suitable principles and advantages disclosed herein. The terminals 155A and 154B can serve, for example, as an input contact and an output contact. Although two terminals are illustrated, any suitable number of terminals can be implemented for a particular application. The acoustic wave component 152 and the other circuitry 153 are on a common packaging substrate 156 in FIG. 12. The package substrate 156 can be a laminate substrate. The terminals 155A and 155B can be electrically connected to contacts 157A and 157B, respectively, on the packaging substrate 156 by way of electrical connectors 158A and 158B, respectively. The electrical connectors 158A and 158B can be bumps or wire bonds, for example.

The other circuitry 153 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters, the like, or any suitable combination thereof. The other circuitry 153 can be electrically connected to the one or more acoustic wave filters 154. The radio frequency module 150 can include one or more packaging structures to, for example, provide protection and/or facilitate easier handling of the radio frequency module 150. Such a packaging structure can include an overmold structure formed over the packaging substrate 156. The overmold structure can encapsulate some or all of the components of the radio frequency module 150.

Figure 13:
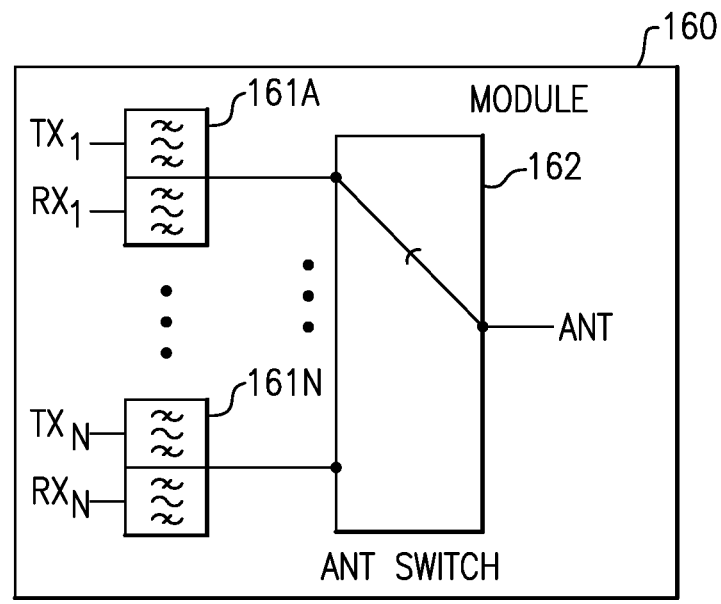
FIG. 13 is a schematic block diagram of a module that includes an antenna switch and duplexers according to an embodiment.

FIG. 13 is a schematic block diagram of a module 160 that includes duplexers 161A to 161N and an antenna switch 162. One or more filters of the duplexers 161A to 161N can include an acoustic wave resonator with two or more resonant frequencies in accordance with any suitable principles and advantages disclosed herein. Any suitable number of duplexers 161A to 161N can be implemented. The antenna switch 162 can have a number of throws corresponding to the number of duplexers 161A to 161N. The antenna switch 162 can include one or more additional throws coupled to one or more filters external to the module 160 and/or coupled to other circuitry. The antenna switch 162 can electrically couple a selected duplexer to an antenna port of the module 160.

Figure 14:
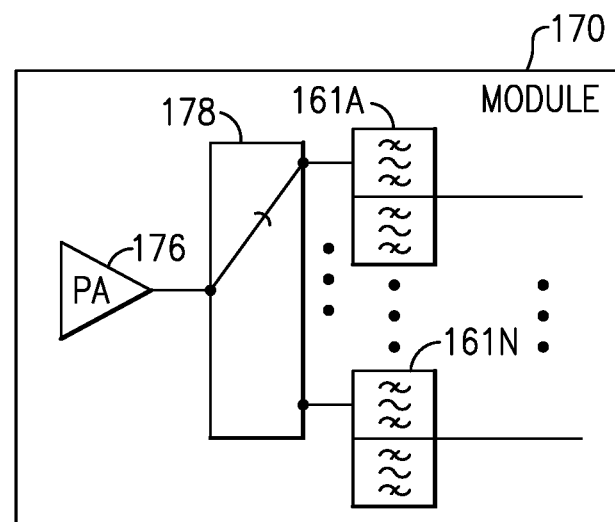
FIG. 14 is a schematic block diagram of a module that includes a power amplifier, a radio frequency switch, and duplexers according to an embodiment.

FIG. 14 is a schematic block diagram of a module 170 that includes a power amplifier 176, a radio frequency switch 178, and duplexers 161A to 161N according to an embodiment. The power amplifier 176 can amplify a radio frequency signal. The radio frequency switch 178 can be a multi-throw radio frequency switch. The radio frequency switch 178 can electrically couple an output of the power amplifier 176 to a selected transmit filter of the duplexers 161A to 161N. One or more filters of the duplexers 161A to 161N can include any suitable number of acoustic wave resonators that have a plurality of resonant frequencies in accordance with any suitable principles and advantages disclosed herein. Any suitable number of duplexers 161A to 161N can be implemented.

Figure 15:
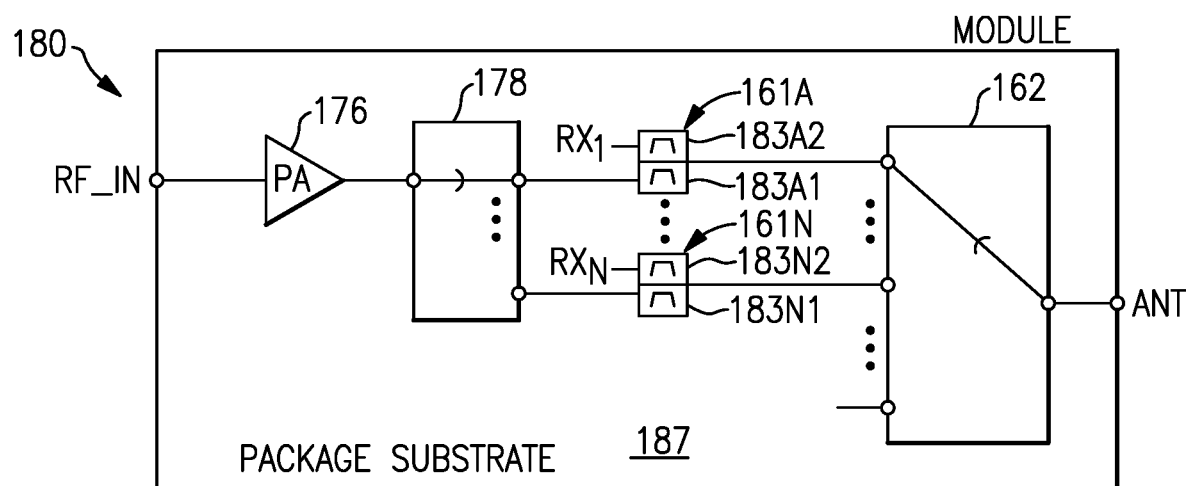
FIG. 15 is a schematic diagram of a radio frequency module that includes an acoustic wave filter according to an embodiment.

FIG. 15 is a schematic diagram of a radio frequency module 180 that includes an acoustic wave filter according to an embodiment. As illustrated, the radio frequency module 180 includes duplexers 161A to 161N that include respective transmit filters 183A1 to 183N1 and respective receive filters 183A2 to 183N2, a power amplifier 176, a select switch 178, and an antenna switch 162. The radio frequency module 180 can include a package that encloses the illustrated elements. The illustrated elements can be disposed on a common packaging substrate 187. The packaging substrate 187 can be a laminate substrate, for example. A radio frequency module that includes a power amplifier can be referred to as a power amplifier module. A radio frequency module can include a subset of the elements illustrated in FIG. 15 and/or additional elements. The radio frequency module 180 may include any one of the acoustic wave devices with a plurality of resonant frequencies in accordance with any suitable principles and advantages disclosed herein.

The duplexers 161A to 161N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 183A1 to 183N1 can include an acoustic wave resonator with a plurality of resonant frequencies in accordance with any suitable principles and advantages disclosed herein. Similarly, one or more of the receive filters 183A2 to 183N2 can include an acoustic wave resonator with a plurality of resonant frequencies in accordance with any suitable principles and advantages disclosed herein. Although FIG. 15 illustrates duplexers, any suitable principles and advantages disclosed herein can be implemented in other multiplexers (e.g., quadplexers, hexaplexers, octoplexers, etc.) and/or in switch-plexers.

The power amplifier 176 can amplify a radio frequency signal. The illustrated switch 178 is a multi-throw radio frequency switch. The switch 178 can electrically couple an output of the power amplifier 176 to a selected transmit filter of the transmit filters 183A1 to 183N1. In some instances, the switch 178 can electrically connect the output of the power amplifier 176 to more than one of the transmit filters 183A1 to 183N1. The antenna switch 162 can selectively couple a signal from one or more of the duplexers 161A to 161N to an antenna port ANT. The duplexers 161A to 161N can be associated with different frequency bands and/or different modes of operation (e.g., different power modes, different signaling modes, etc.).

Figure 16A:
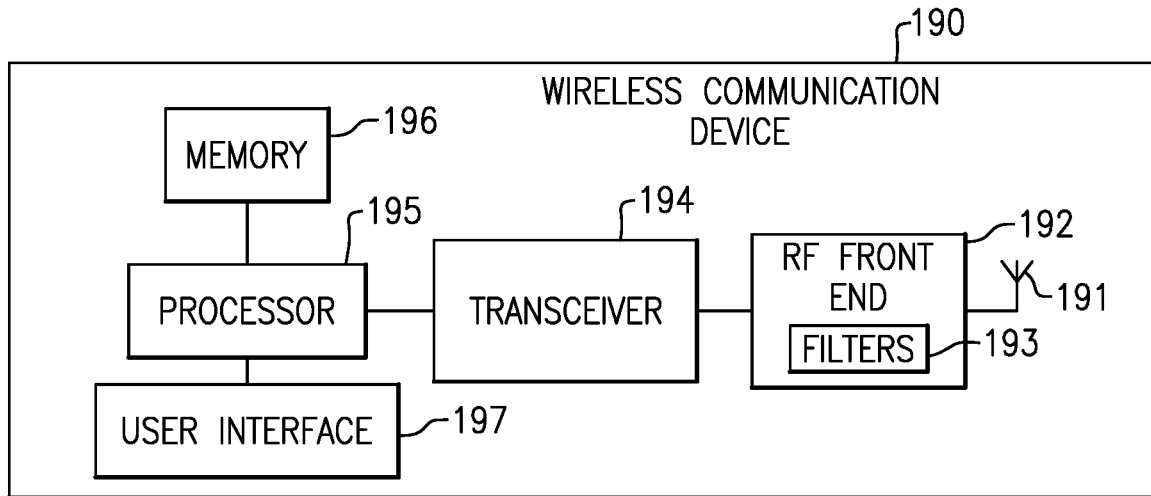
FIG. 16A is a schematic block diagram of a wireless communication device that includes an acoustic wave filter according to an embodiment.

The filters with an acoustic wave resonator having a plurality of resonant frequencies disclosed herein can be implemented in a variety of wireless communication devices. FIG. 16A is a schematic diagram of a wireless communication device 190 that includes filters 193 in a radio frequency front end 192 according to an embodiment. One or more of the filters 193 can include an acoustic wave resonator having a plurality of resonant frequencies in accordance with any suitable principles and advantages disclosed herein. The wireless communication device 190 can be any suitable wireless communication device. For instance, a wireless communication device 190 can be a mobile phone, such as a smart phone. As illustrated, the wireless communication device 190 includes an antenna 191, an RF front end 192, a transceiver 194, a processor 195, a memory 196, and a user interface 197. The antenna 191 can transmit RF signals provided by the RF front end 192. Such RF signals can include carrier aggregation signals. The antenna 191 can receive RF signals and provide the received RF signals to the RF front end 192 for processing. Such RF signals can include carrier aggregation signals. The wireless communication device 190 can include two or more antennas in certain instances.

The RF front end 192 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 192 can transmit and receive RF signals associated with any suitable communication standards. One or more of the filters 193 can include an acoustic wave resonator with a plurality of resonant frequencies that includes any suitable combination of features of the embodiments disclosed above.

The transceiver 194 can provide RF signals to the RF front end 192 for amplification and/or other processing. The transceiver 194 can also process an RF signal provided by a low noise amplifier of the RF front end 192. The transceiver 194 is in communication with the processor 195. The processor 195 can be a baseband processor. The processor 195 can provide any suitable base band processing functions for the wireless communication device 190. The memory 196 can be accessed by the processor 195. The memory 196 can store any suitable data for the wireless communication device 190. The user interface 197 can be any suitable user interface, such as a display with touch screen capabilities.

Figure 16B:
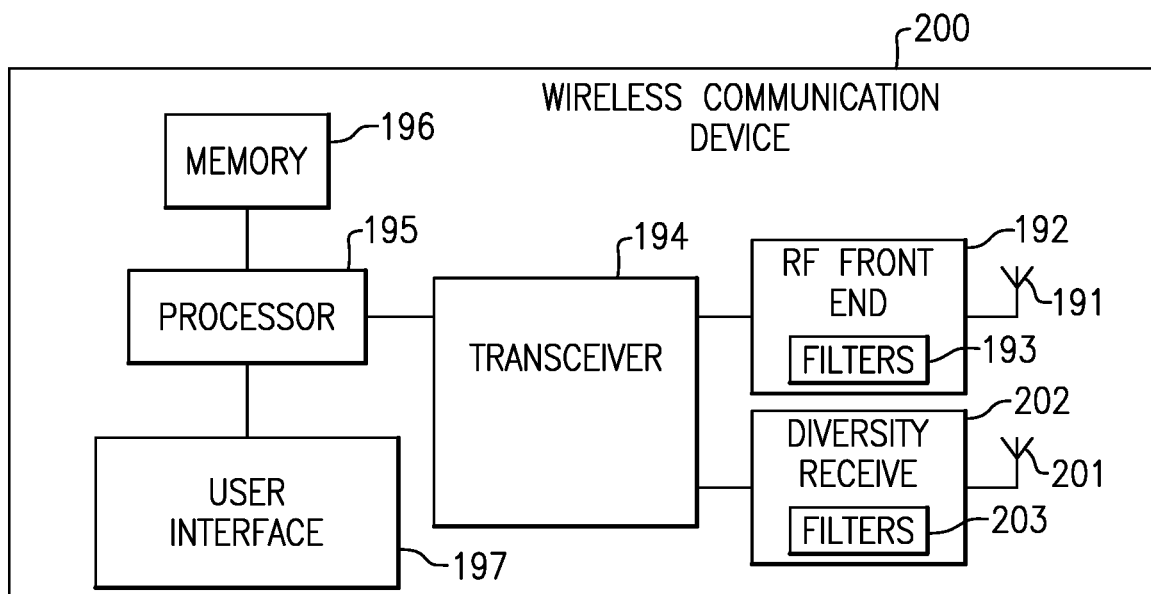
FIG. 16B is a schematic block diagram of another wireless communication device that includes an acoustic wave filter according to an embodiment.

FIG. 16B is a schematic diagram of a wireless communication device 200 that includes filters 193 in a radio frequency front end 192 and second filters 203 in a diversity receive module 202. The wireless communication device 200 is like the wireless communication device 190 of FIG. 16A, except that the wireless communication device 200 also includes diversity receive features. As illustrated in FIG. 16B, the wireless communication device 200 includes a diversity antenna 201, a diversity module 202 configured to process signals received by the diversity antenna 201 and including filters 203, and a transceiver 194 in communication with both the radio frequency front end 192 and the diversity receive module 202. One or more of the second filters 203 can include an acoustic wave resonator having a plurality of resonant frequencies in accordance with any suitable principles and advantages disclosed herein.

Although embodiments disclosed herein relate to surface acoustic wave filters and/or resonators, any suitable principles and advantages disclosed herein can be applied to other types of acoustic wave devices that include an IDT electrode, such as Lamb wave devices and/or boundary wave devices. For example, any suitable combination of features of the acoustic velocity adjustment structures disclosed herein can be applied to a Lamb wave device and/or a boundary wave device.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave resonator having at least a first resonant frequency and a second resonant frequency, the surface acoustic wave resonator comprising:
    an interdigital transducer electrode over a piezoelectric layer, the interdigital transducer electrode including fingers having a first pitch; and
    a set of reflectors over the piezoelectric layer, the set of reflectors including a number of reflectors having a second pitch, the first pitch being greater than the second pitch, and the number of reflectors configured to compensate for degradation of a quality factor of the surface acoustic wave resonator due to having the first pitch greater than the second pitch.

2. The surface acoustic wave resonator of claim 1 further comprising a second set of reflectors over the piezoelectric layer, wherein the interdigital transducer electrode is positioned between the set of reflectors and the second set of reflectors.

3. The surface acoustic wave resonator of claim 2 wherein the second set of reflectors includes a second number of reflectors having a third pitch, the first pitch of the interdigital transducer electrode is greater than the third pitch.

4. The surface acoustic wave resonator of claim 3 wherein the second pitch and the third pitch are the same.

5. The surface acoustic wave resonator of claim 3 wherein the second pitch and the third pitch are different.

6. The surface acoustic wave resonator of claim 1 wherein the first pitch is 1% to 20% greater than the second pitch.

7. The surface acoustic wave resonator of claim 6 wherein the first pitch is 10% to 20% greater than the second pitch.

8. An acoustic wave filter configured to filter a radio frequency signal, the acoustic wave filter comprising the surface acoustic wave resonator of claim 1 as a shunt acoustic wave resonator.

9. A surface acoustic wave resonator having at least a first resonant frequency and a second resonant frequency, the surface acoustic wave resonator comprising:
    an interdigital transducer electrode over a piezoelectric layer, the interdigital transducer electrode including fingers having a first pitch;
    a set of reflectors over the piezoelectric layer, the set of reflectors including a number of reflectors having a second pitch, the first pitch being greater than the second pitch, and the number of reflectors configured so as to compensate for reduction of a reflection of the surface acoustic wave resonator provided by the set of reflectors due to having the first pitch greater than the second pitch.

10. The surface acoustic wave resonator of claim 9 further comprising a second set of reflectors over the piezoelectric layer, wherein the interdigital transducer electrode is positioned between the set of reflectors and the second set of reflectors, the second set of reflectors includes a second number of reflectors having a third pitch, the first pitch of the interdigital transducer electrode is greater than the third pitch.

11. The surface acoustic wave resonator of claim 10 wherein the second pitch and the third pitch are the same.

12. The surface acoustic wave resonator of claim 10 wherein the second pitch and the third pitch are different.

13. The surface acoustic wave resonator of claim 9 wherein the first pitch is 1% to 20% greater than the second pitch.

14. The surface acoustic wave resonator of claim 13 wherein the first pitch is 10% to 20% greater than the second pitch.

15. An acoustic wave filter configured to filter a radio frequency signal, the acoustic wave filter comprising the surface acoustic wave resonator of claim 9 as a shunt acoustic wave resonator.

16. A packaged module including a substrate supporting at least one filter, the at least one filter including one or more surface acoustic wave resonators of claim 15, wherein the packaged module is a radio frequency front end module or a diversity receive module.

17. A wireless communication device including an antenna, a transceiver, and one or more of the packaged modules of claim 16.

18. An acoustic wave filter, the acoustic wave filter comprising:
    shunt acoustic wave resonators including a first shunt acoustic wave resonator, the first shunt acoustic wave resonator including an interdigital transducer electrode having fingers with a first pitch and a set of reflectors having a number of reflectors with a second pitch, the first pitch being greater than the second pitch, the number of reflectors configured so as to compensate for degradation of a quality factor of the surface acoustic wave resonator due to having the first pitch greater than the second pitch, and the first shunt acoustic resonator having at least a first resonant frequency and a second resonant frequency; and
    series acoustic wave resonators, the series acoustic wave resonators and the shunt acoustic wave resonators together arranged to filter a radio frequency signal.

19. The acoustic wave filter of claim 18 wherein the first pitch is 10% to 20% greater than the second pitch.

20. The acoustic wave filter of claim 18 wherein the first shunt acoustic wave resonator further includes a second set of reflectors having a second number of reflectors with a third pitch, the interdigital transducer electrode is positioned between the set of reflectors and the second set of reflectors, the first pitch of the interdigital transducer electrode is greater than the third pitch.

* * * * *